(12) United States Patent
Kim et al.

(10) Patent No.: US 12,733,341 B2
(45) Date of Patent: Sep. 8, 2026

(54) DISPLAY DEVICE

(71) Applicant: Samsung Display Co., Ltd., Yongin-si (KR)

(72) Inventors: Keunwoo Kim, Seongnam-si (KR); Taewook Kang, Seongnam-si (KR); Jang-Hyun Kim, Hwaseong-si (KR); Joon Woo Bae, Hwaseong-si (KR); Jaeseob Lee, Seoul (KR); Donggyu Jin, Hwaseong-si (KR); Sanggun Choi, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 685 days.

(21) Appl. No.: 17/739,501

(22) Filed: May 9, 2022

(65) Prior Publication Data

US 2023/0026562 A1 Jan. 26, 2023

(30) Foreign Application Priority Data

Jul. 20, 2021 (KR) ........................ 10-2021-0094660

(51) Int. Cl.
*H10K 59/121* (2023.01)

(52) U.S. Cl.
CPC ..... *H10K 59/1213* (2023.02); *H10K 59/1216* (2023.02)

(58) Field of Classification Search
None
See application file for complete search history.

(56) References Cited

U.S. PATENT DOCUMENTS 1,034,772 A * 8/1912 Everett et al. ......... G03B 27/22 355/110
6,897,099 B2 5/2005 Yoo et al.
(Continued)

FOREIGN PATENT DOCUMENTS

CN 110114885 A 8/2019
CN 111834416 A 10/2020
(Continued)

OTHER PUBLICATIONS

Internet: Wikipedia "Stopping and Range of Ions in Matter"; https://en.wikipedia.org/wiki/Stopping_and_Range_of_Ions_in_Matter ; 4 Sheets.

(Continued)

*Primary Examiner* — Sarah K Salerno
(74) *Attorney, Agent, or Firm* — Womble Bond Dickinson (US) LLP

(57) ABSTRACT

A display device includes a first transistor, a second transistor electrically connected thereto, n third transistors electrically connected to a gate of the first transistor and connected to each other in series, a capacitor to be charged with a voltage corresponding to a data signal, and a light emitting element, wherein the third transistors include a semiconductor area including a channel area, a source area, a drain area, and a gate overlapping the channel area, wherein the source area or the drain area that is closer to the gate of the first transistor, and that is of the third transistor closest to the gate of the first transistor, includes a first area, and a second area between the first area and the channel area, having a doping concentration that is lower than that of the first area, and having a width that is less than that of the first area.

19 Claims, 18 Drawing Sheets

(56) References Cited

U.S. PATENT DOCUMENTS

| | | | | |
|---|---|---|---|---|
| 7,123,323 | B2 * | 10/2006 | Honbo | G02F 1/136209<br>349/44 |
| 8,093,593 | B2 * | 1/2012 | Kokubo | H10D 86/421<br>257/E29.151 |
| 10,347,772 | B2 | 7/2019 | Kim | |
| 10,998,392 | B2 | 5/2021 | Tsuboi | |
| 2018/0151650 | A1 * | 5/2018 | Ha | H01L 27/124 |
| 2020/0342815 | A1 * | 10/2020 | Kim | G09G 3/3233 |
| 2021/0057502 | A1 * | 2/2021 | Kim | H01L 27/1251 |
| 2021/0066429 | A1 | 3/2021 | Kim et al. | |
| 2021/0091233 | A1 | 3/2021 | Yang et al. | |
| 2021/0151540 | A1 | 5/2021 | Wang | |
| 2021/0280652 | A1 | 9/2021 | Kim et al. | |
| 2022/0149203 | A1 * | 5/2022 | Hanada | H10D 30/6713 |

FOREIGN PATENT DOCUMENTS

| | | | |
|---|---|---|---|
| JP | H 06232152 | A | 8/1994 |
| JP | H07-147411 | A | 6/1995 |
| JP | 2001-052873 | A | 2/2001 |
| JP | 2012-141525 | A | 7/2012 |
| KR | 10-1999-0004943 | A | 1/1999 |
| KR | 10-0274546 | B1 | 12/2000 |
| KR | 10-2004-0009378 | A | 1/2004 |
| KR | 10-0992137 | B1 | 11/2010 |
| KR | 10-2017-0113865 | A | 10/2017 |
| KR | 10-2020-0124365 | A | 11/2020 |
| KR | 10-2021-0022807 | | 3/2021 |
| WO | 2004/082029 | A1 | 9/2004 |

OTHER PUBLICATIONS

Kim, et al., "Experimental and Physics-Based Analysis of Leakage Currents for LTPS TFTs in AMOLED Displays", 37 SID 2021 Digest, 4 sheets.

Kim, et al., "Leakage Power Analysis of 25-nm Double-Gate CMOS Devices and Circuits", IEEE Transactions on Electron Devices, vol. 52, No. 5, May 2005, pp. 980-986.

Tada, et al., "Phosphorus and Boron Ion Implantation Profiles in Molybdenum Gates", IEEE Transactions on Electron Devices, vol. 54, No. 1, Jan. 2007; pp. 173-178.

* cited by examiner

FIG. 6E
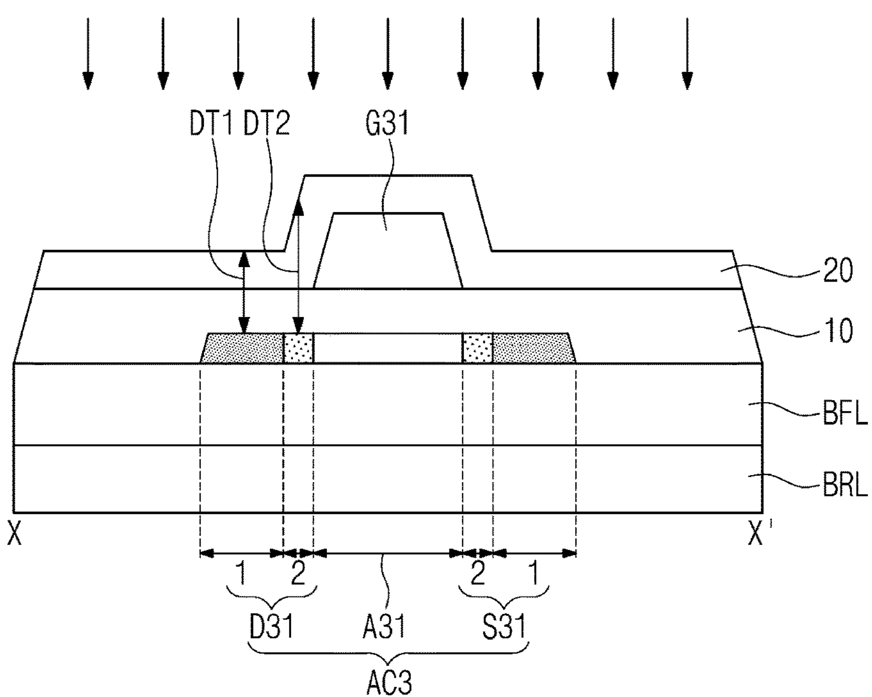
FIG. 6F
FIG. 6G
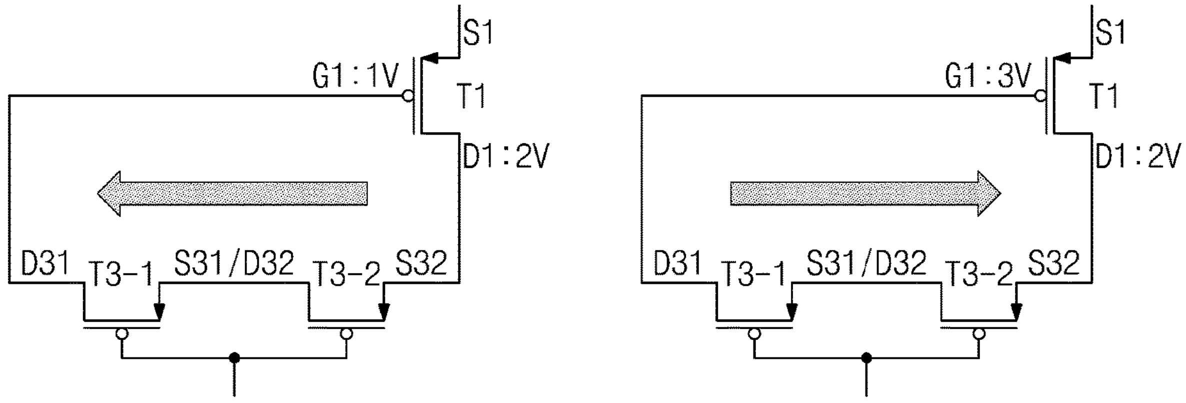

DISPLAY DEVICE

CROSS-REFERENCE TO RELATED APPLICATION

This application claims priority to, and the benefit of, Korean Patent Application No. 10-2021-0094660, filed on Jul. 20, 2021, the contents of which are hereby incorporated by reference in its entirety.

BACKGROUND

1. Field

The present disclosure relates to a display device with improved operation characteristics.

2. Description of the Related Art

A display device includes a plurality of pixels and a driving circuit (e.g., a scan driving circuit and a data driving circuit) for controlling the pixels. Each of the pixels includes a display element and a pixel circuit controlling the display element. The pixel circuit includes a plurality of transistors connected to each other.

The scan driving circuit and/or the data driving circuit are/is formed through the same process as the pixels. The scan driving circuit and/or the data driving circuit include/includes a plurality of transistors connected to each other.

SUMMARY

The present disclosure provides a display device with improved display quality.

Embodiments of the present disclosure provide a display device including a first transistor, a second transistor electrically connected to the first transistor, and configured to output a data signal, n (n being a natural number equal to or greater than 2) third transistors electrically connected to a gate of the first transistor and connected to each other in series, a capacitor configured to be charged with a voltage corresponding to the data signal, and a light emitting element electrically connected to the first transistor, wherein each of the third transistors includes a semiconductor area including a channel area, a source area, and a drain area spaced from the source area with the channel area therebetween in an extension direction, and a gate overlapping the channel area, wherein a first area among the source area and the drain area that is closer to the gate of the first transistor, and that is of a first one of the third transistors that is located closest to the gate of the first transistor among the third transistors, includes a first area, and a second area between the first area and the channel area, having a doping concentration that is lower than a doping concentration of the first area, and having a width that is less than a width of the first area in a reference direction that is substantially perpendicular to the extension direction.

A second area among the source area and the drain area that is farther from the gate of the first transistor, and that is of a second one of the third transistors that is located farthest from the gate of the first transistor among the third transistors, may include a third area, and a fourth area between the third area and the channel area, having a doping concentration that is lower than a doping concentration of the third area, and having a width that is less than a width of the third area in the reference direction.

A third area among the source area and the drain area that is farther from the gate of the first transistor, and that is of the first one of the third transistors, may include a third area, and a fourth area between the third area and the channel area, and having a doping concentration that is lower than a doping concentration of the third area.

The third area and the fourth area may have substantially a same width in the reference direction.

The width of the second area in the reference direction may be in a range from about 1 μm to about 2 μm.

The width of the second area may be about 10% to about 50% less than the width of the first area.

The second area may have a length from about 0.1 μm to about 0.5 μm in the extension direction.

The first transistor and the third transistors may include P-type polysilicon transistors, wherein the third transistors are connected to each other in series between the gate of the first transistor and a source area or a drain area of a semiconductor area of the first transistor.

The source area of the first one of the third transistors and the drain area of a second one of the third transistors that is farthest from the gate of the first transistor among the third transistors may have substantially a same width in the reference direction.

The drain area and the source area of a third one of the third transistors between the first one of the third transistors and a second one of the third transistors that is farthest from the gate of the first transistor among the third transistors may have substantially a same width in the reference direction.

The first transistor may include a semiconductor area including a channel area overlapping the gate of the first transistor, a source area, and a drain area spaced apart from the source area with the channel area therebetween, wherein at least one of the source area and the drain area of the first transistor has a width that is greater than a width of the channel area of the first transistor.

The width of the at least one of the source area and the drain area of the first transistor may be about 5% to about 20% greater than the width of the channel area of the first transistor.

Each of the source area and the drain area of the first transistor may include a third area, and a fourth area between the third area and the channel area, and having a doping concentration that is lower than a doping concentration of the third area, wherein the third area and the fourth area have substantially a same width.

The width of the source area or the drain area of the first transistor may be greater than a width of the semiconductor area of each of the third transistors.

The first transistor and the third transistors may include P-type polysilicon transistors, wherein the third transistors are connected between the gate of the first transistor and a voltage line for receiving an initialization voltage.

The capacitor may be electrically connected between the gate of the first transistor and a voltage line for receiving a power source voltage.

Embodiments of the present disclosure provide a display device including a first transistor, a second transistor electrically connected to the first transistor, and configured to output a data signal, n (n is a natural number equal to or greater than 2) third transistors electrically connected to a gate of the first transistor, and connected to each other in series, a capacitor configured to be charged with a voltage corresponding to the data signal, and a light emitting element electrically connected to the first transistor, wherein each of the third transistors includes a semiconductor area including a channel area, a source area, and a drain area spaced apart from the source area with the channel area therebetween in an extension direction, and a gate overlapping the channel area, wherein an area among the source area and the drain area that is farther from the gate of the first transistor, and that is of a third transistor that is located farthest from the gate of the first transistor among the third transistors includes a first area, and a second area between the first area and the channel area, having a doping concentration that is lower than a doping concentration of the first area, and having a width that is less than a width of the first area in a reference direction that is substantially perpendicular to the extension direction.

Embodiments of the present disclosure provide a display device including a first transistor, a second transistor electrically connected to the first transistor, and configured to output a data signal, a third transistor electrically connected to a gate of the first transistor, and a light emitting element electrically connected to the first transistor, wherein the third transistor includes a semiconductor area including a channel area, a source area, and a drain area spaced apart from the source area with the channel area therebetween in an extension direction, and a gate overlapping the channel area, and wherein at least one of the drain area and the source area includes a first area, and a second area between the first area and the channel area, having a doping concentration that is lower than a doping concentration of the first area, and having a width that is less than a width of the first area in a reference direction substantially perpendicular to the extension direction.

Embodiments of the present disclosure provide a display device including a first transistor, a second transistor electrically connected to the first transistor, and configured to output a data signal, n (n is a natural number equal to or greater than 1) third transistors electrically connected to a gate of the first transistor, and connected to each other in series, and a light emitting element electrically connected to the first transistor, wherein each of the first, second, and third transistors includes a semiconductor area including a channel area, a source area, and a drain area spaced apart from the source area with the channel area therebetween in an extension direction, and a gate overlapping the channel area, wherein each of the drain area and the source area includes a first area, and a second area between the first area and the channel area, having a doping concentration that is lower than a doping concentration of the first area, and wherein each of the source area of the first transistor and the drain area of the first transistor has a width that is greater than a width of the channel area of the first transistor.

The width of the drain area of the first transistor may be about 5% to about 20% greater than the width of the channel area of the first transistor.

A width of the second area of the source area of the first transistor may be substantially a same as a width of the second area of the drain area of the first transistor.

The width of the drain area of the first transistor may be greater than the width of the drain area of the third transistors.

A width of at least one of the source area and the drain area of the third transistors may be substantially a same as the width of the channel area of the third transistors.

According to the above, a drain/source field reduction effect is obtained in a low doping area with a narrow area. A resistance in the low doping area increases to a desired level by reducing a width of the low doping area even though its length is short.

As the drain field of the transistors connected to the gate of a driving transistor is reduced, a leakage current of the transistors is reduced. During a light emitting period, the driving transistor provides a current corresponding to a data voltage to the light emitting element.

The width of the low doping area of the driving transistor increases, and thus, a decrease in driving current of the driving transistor is reduced or prevented.

BRIEF DESCRIPTION OF THE DRAWINGS

The above and other aspects of the present disclosure will become readily apparent by reference to the following detailed description when considered in conjunction with the accompanying drawings wherein:

FIG. 6E is a cross-sectional view showing a doping process of a transistor;

FIG. 6F is a circuit diagram showing an operation of a first transistor and third transistors in a light emitting period corresponding to a data signal with high grayscale;

FIG. 6G is a circuit diagram showing an operation of a first transistor and third transistors in a light emitting period corresponding to a data signal with intermediate grayscale;

DETAILED DESCRIPTION

Figure 1:
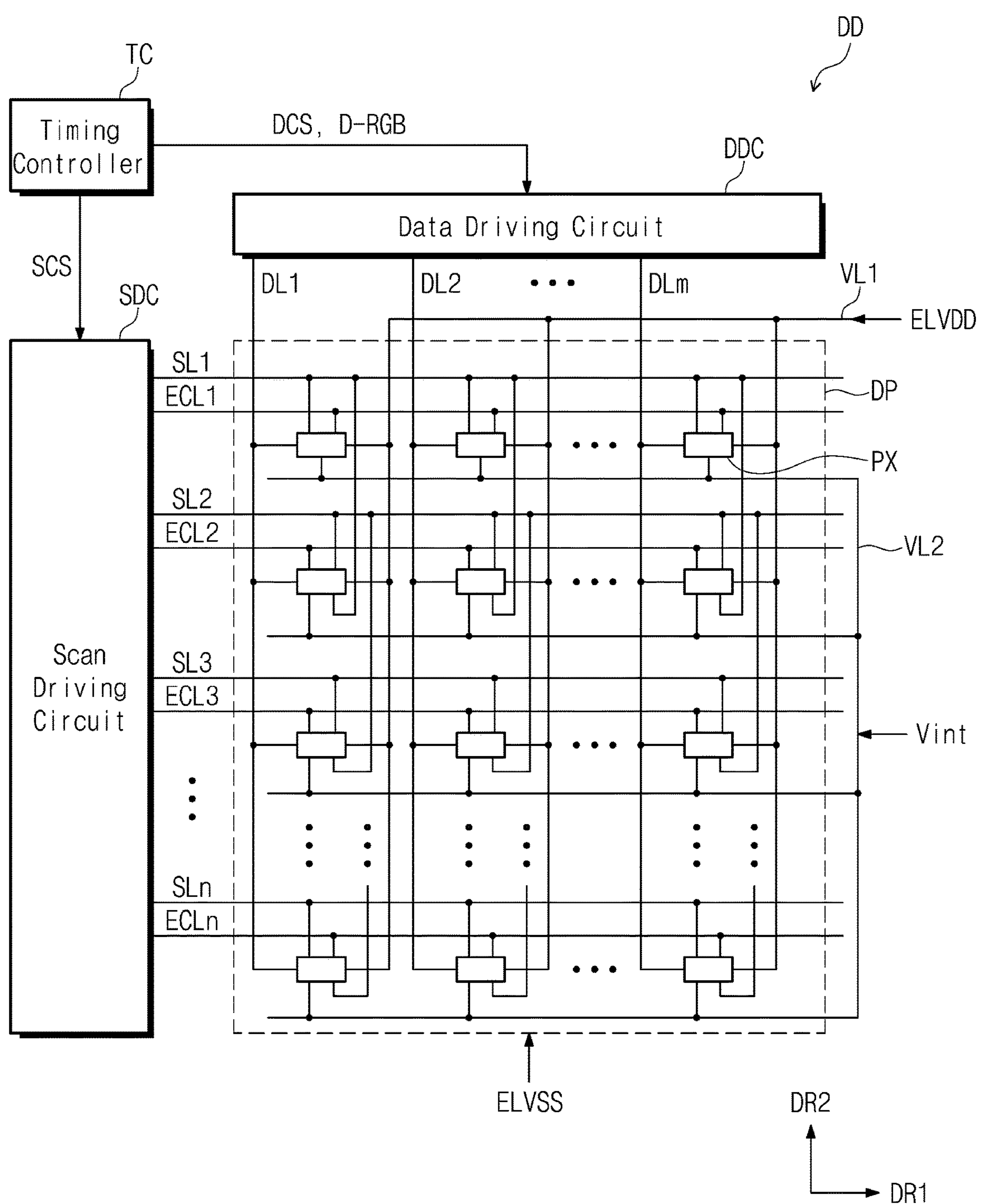
FIG. 1 is a block diagram showing a display device according to some embodiments of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

In the present disclosure, it will be understood that when an element or layer is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" may include any and all combinations of one or more of the associated listed items.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

Further, in this specification, the phrase "on a plane," or "plan view," means viewing a target portion from the top, and the phrase "on a cross-section" means viewing a cross-section formed by vertically cutting a target portion from the side.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Hereinafter, the present disclosure will be explained in detail with reference to the accompanying drawings.

FIG. 1 is a block diagram showing a display device DD according to some embodiments of the present disclosure.

The display device DD may include a timing controller TC, a scan driving circuit SDC, a data driving circuit DDC, and a display panel DP. In some embodiments, the display panel DP will be described as a light emitting type display panel. The light emitting type display panel may include an organic light emitting display panel or an inorganic light emitting display panel.

The timing controller TC may receive input image signals, may convert a data format of the input image signals to a data format appropriate to an interface between the timing controller TC and the data driving circuit DDC, and may generate image data D-RGB. The timing controller TC may output the image data D-RGB and various control signals DCS and SCS.

The scan driving circuit SDC may receive a scan control signal SCS from the timing controller TC. The scan control signal SCS may include a vertical start signal to start an operation of the scan driving circuit SDC, and a clock signal to determine an output timing of signals. The scan driving circuit SDC may generate a plurality of scan signals, and may sequentially output the scan signals to corresponding scan signal lines SL1 to SLn. In addition, the scan driving circuit SDC may generate a plurality of emission control signals in response to the scan control signal SCS, and may output the emission control signals to corresponding emission control lines ECL1 to ECLn.

In FIG. 1, the scan signals and the emission control signals are output from one scan driving circuit SDC, however, the present disclosure should not be limited thereto or thereby. According to some embodiments, the display device DD may include a plurality of scan driving circuits. According to some embodiments, the driving circuit that generates and outputs the scan signals may be separately provided from the driving circuit that generates and outputs the emission control signals.

The data driving circuit DDC may receive a data control signal DCS and the image data D-RGB from the timing controller TC. The data driving circuit DDC may convert the image data D-RGB to data signals, and may output the data signals to a plurality of data lines DL1 to DLm described later. The data signals may be analog voltages corresponding to grayscale values of the image data D-RGB.

The display panel DP may include the scan signal lines SL1 to SLn, the emission control lines ECL1 to ECLn, the data lines DL1 to DLm, a first voltage line VL1, a second voltage line VL2, and a plurality of pixels PX.

The scan signal lines SL1 to SLn and the emission control lines ECL1 to ECLn may extend in a first direction DR1 and may be arranged in a second direction DR2. The data lines DL1 to DLm may cross the scan signal lines SL1 to SLn.

The first voltage line VL1 may receive a first power source voltage ELVDD. In some embodiments, a voltage line may be further provided to receive a second power source voltage ELVSS. The second power source voltage ELVSS may have a level that is lower than that of the first power source voltage ELVDD. The second voltage line VL2 may receive an initialization voltage Vint. The initialization voltage Vint may have a level that is lower than that of the first power source voltage ELVDD.

In the above-descriptions, the display device DD according to some embodiments is described with reference to FIG. 1, however, the display device DD of the present disclosure should not be limited thereto or thereby. Signal lines may be added or omitted depending on the configuration of the pixel circuit. In addition, a connection relationship between one pixel PX and the signal lines may be changed.

The pixels PX may include a plurality of groups that generates lights having color that are different from each other. For instance, the pixels PX may include a first group of red pixels generating a red color light, a second group of green pixels generating a green color light, and a third group of blue pixels generating a blue color light. A light emitting diode of the red pixel, a light emitting diode of the green pixel, and a light emitting diode of the blue pixel may include light emitting layers containing different respective materials.

The pixel circuit may include a plurality of transistors and at least one capacitor. At least one of the scan driving circuit SDC and the data driving circuit DDC may include a plurality of transistors formed through the same process as the pixel circuit.

The above-mentioned signal lines, the pixels PX, the scan driving circuit SDC, and the data driving circuit DDC may be formed on a base substrate through multiple photolithography processes and etching processes.

Figure 2:
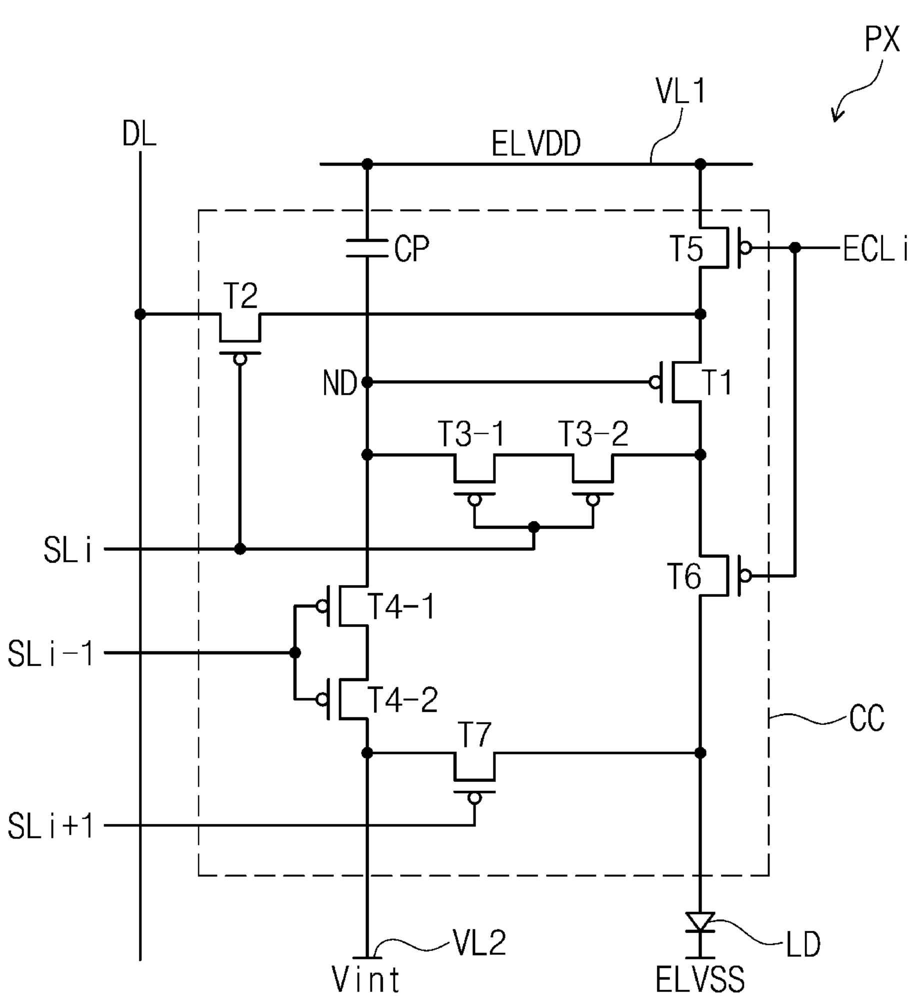
FIG. 2 is an equivalent circuit diagram showing a pixel according to some embodiments of the present disclosure.
Figure 3:
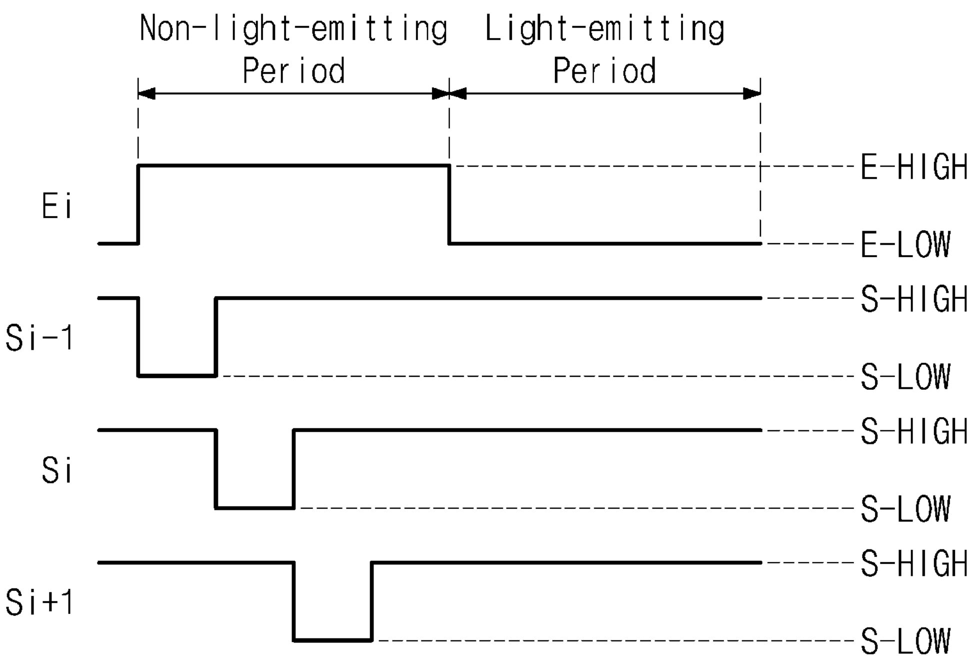
FIG. 3 is a waveform diagram showing driving signals used to drive the pixel shown in FIG. 2.

FIG. 2 is an equivalent circuit diagram showing a pixel PX according to some embodiments of the present disclosure. FIG. 3 is a waveform diagram showing driving signals used to drive the pixel PX shown in FIG. 2.

The pixel PX may include a light emitting element LD and a pixel circuit CC. The pixel circuit CC may include a first transistor T1, a second transistor T2, third transistors T3-1 and T3-2, fourth transistors T4-1 and T4-2, a fifth transistor T5, a sixth transistor T6, a seventh transistor T7, and a capacitor CP. The pixel circuit CC may control an amount of current flowing through the light emitting element LD in response to the data signal. The light emitting element LD may emit a light at a brightness (e.g., a predetermined brightness) in response to the amount of current provided from the pixel circuit CC.

Each of the first to seventh transistors T1 to T7 may include a source, a drain, a channel, and a gate. The source, the drain, and the channel may be implemented as different areas of a semiconductor pattern. In some embodiments, each of the first to seventh transistors T1 to T7 will be described as a P-type transistor, however, it should not be limited thereto or thereby. According to some embodiments, at least one of the first to seventh transistors T1 to T7 may be an N-type transistor. The source and the drain of the P-type transistor may respectively correspond to the drain and the source of the N-type transistor. For example, the third transistors T3-1 and T3-2 and the fourth transistors T4-1 and T4-2 may be the N-type transistor. A drain/source field reduction effect described later may occur in the N-type third transistors T3-1 and T3-2 and the fourth transistors T4-1 and T4-2.

The source of the first transistor T1 may be electrically connected to the first voltage line VL1 via the fifth transistor T5, and the drain of the first transistor T1 may be electrically connected to an anode of the light emitting element LD via the sixth transistor T6. The first transistor T1 may be referred to as a driving transistor. The first transistor T1 may control the amount of current flowing through the light emitting element LD in response to a voltage applied to the gate thereof. The gate of the first transistor T1 may be referred to as a reference node ND.

The second transistor T2 may be electrically connected between the data line DL and the first transistor T1. The gate of the second transistor T2 may be electrically connected to an i-th scan signal line SLi. The second transistor T2 may be referred to as a switching transistor.

The third transistors T3-1 and T3-2 may be electrically connected between the gate and the drain of the first transistor T1. In some embodiments, two third transistors T3-1 and T3-2 connected to each other in series are shown as a representative example, however, the present disclosure should not be limited thereto or thereby. According to some embodiments, n (n is a natural number equal to or greater than 1) third transistors may be connected between the gate and the drain of the first transistor T1 in series. The gate of each of the third transistors T3-1 and T3-2 may be electrically connected to the i-th scan signal line SLi.

The fourth transistors T4-1 and T4-2 may be electrically connected between the reference node ND and the second voltage line VL2. In some embodiments, two fourth transistors T4-1 and T4-2 connected to each other are shown as a representative example, however, the present disclosure should not be limited thereto or thereby. According to some embodiments, n (n is a natural number equal to or greater than 1) fourth transistors may be electrically connected between the reference node ND and the second voltage line VL2. The gate of each of the fourth transistors T4-1 and T4-2 may be electrically connected to an (i−1)th scan signal line SLi−1.

The fifth transistor T5 may be electrically connected between the first voltage line VL1 and the source of the first transistor T1. The gate of the fifth transistor T5 may be electrically connected to an i-th emission control line ECLi.

The sixth transistor T6 may be electrically connected between the drain of the first transistor T1 and an anode of the light emitting element LD. The gate of the sixth transistor T6 may be electrically connected to the i-th emission control line ECLi.

The seventh transistor T7 may be electrically connected between the second voltage line VL2 and the anode of the light emitting element LD. The gate of the seventh transistor T7 may be electrically connected to an (i+1)th scan signal line SLi+1.

The capacitor CP may be located between the first voltage line VL1 and the reference node ND. The capacitor CP may be charged with a voltage corresponding to the data signal. When the fifth transistor T5 and the sixth transistor T6 are turned on, the amount of current flowing through the first transistor T1 may be determined according to the voltage charged in the capacitor CP.

Referring to FIGS. 2 and 3, the emission control signal Ei may have a high level E-HIGH or a low level E-LOW. Each of the scan signals Si−1, Si, and Si+1 may have a high level S-HIGH or a low level S-LOW.

When the emission control signal Ei has the high level E-HIGH, the fifth transistor T5 and the sixth transistor T6 may be turned off. A period in which the emission control signal Ei has the high level E-HIGH may be defined as a non-light-emitting period of the light emitting element LD.

When an (i−1)th scan signal Si−1 applied to the (i−1)th scan signal line SLi−1 has the low level S-LOW, the fourth transistors T4-1 and T4-2 may be turned on. When the fourth transistors T4-1 and T4-2 are turned on, the initialization voltage Vint may be provided to the reference node ND. The reference node ND and the capacitor CP may be initialized to the initialization voltage Vint.

When an i-th scan signal Si applied to the i-th scan signal line SLi has the low level S-LOW, the second transistor T2 and the third transistor T3 may be turned on. When the second transistor T2 is turned on, the data signal may be applied to the first transistor T1. When the i-th scan signal Si has the low level S-LOW, the first transistor T1 may be connected between the second transistor T2 and the third transistor T3 in a diode configuration. When the first transistor T1 is turned on, a voltage corresponding to the data signal may be applied to the reference node ND. The voltage corresponding to the data signal may be a voltage obtained by subtracting a threshold voltage of the first transistor T1 from the data signal. The capacitor CP may be charged with the voltage corresponding to the data signal.

When an (i+1)th scan signal Si+1 has the low level S-LOW, the seventh transistor T7 may be turned on. When the seventh transistor T7 is turned on, the initialization voltage Vint may be provided to the anode of the light emitting element LD, and thus, a parasitic capacitor/capacitance of the light emitting element LD may be discharged.

When the emission control signal Ei applied to the i-th emission control line ECLi has the low level E-LOW, the fifth transistor T5 and the sixth transistor T6 may be turned on. When the fifth transistor T5 is turned on, the first power source voltage ELVDD may be provided to the first transistor T1. When the sixth transistor T6 is turned on, the first transistor T1 may be electrically connected to the light emitting element LD. Accordingly, the light emitting element LD may emit the light at the brightness (e.g., the predetermined brightness) in response to the amount of current supplied thereto. Thus, a period in which the emission control signal Ei has the low level E-LOW may be defined as a light emitting period of the light emitting element LD.

Figure 4:
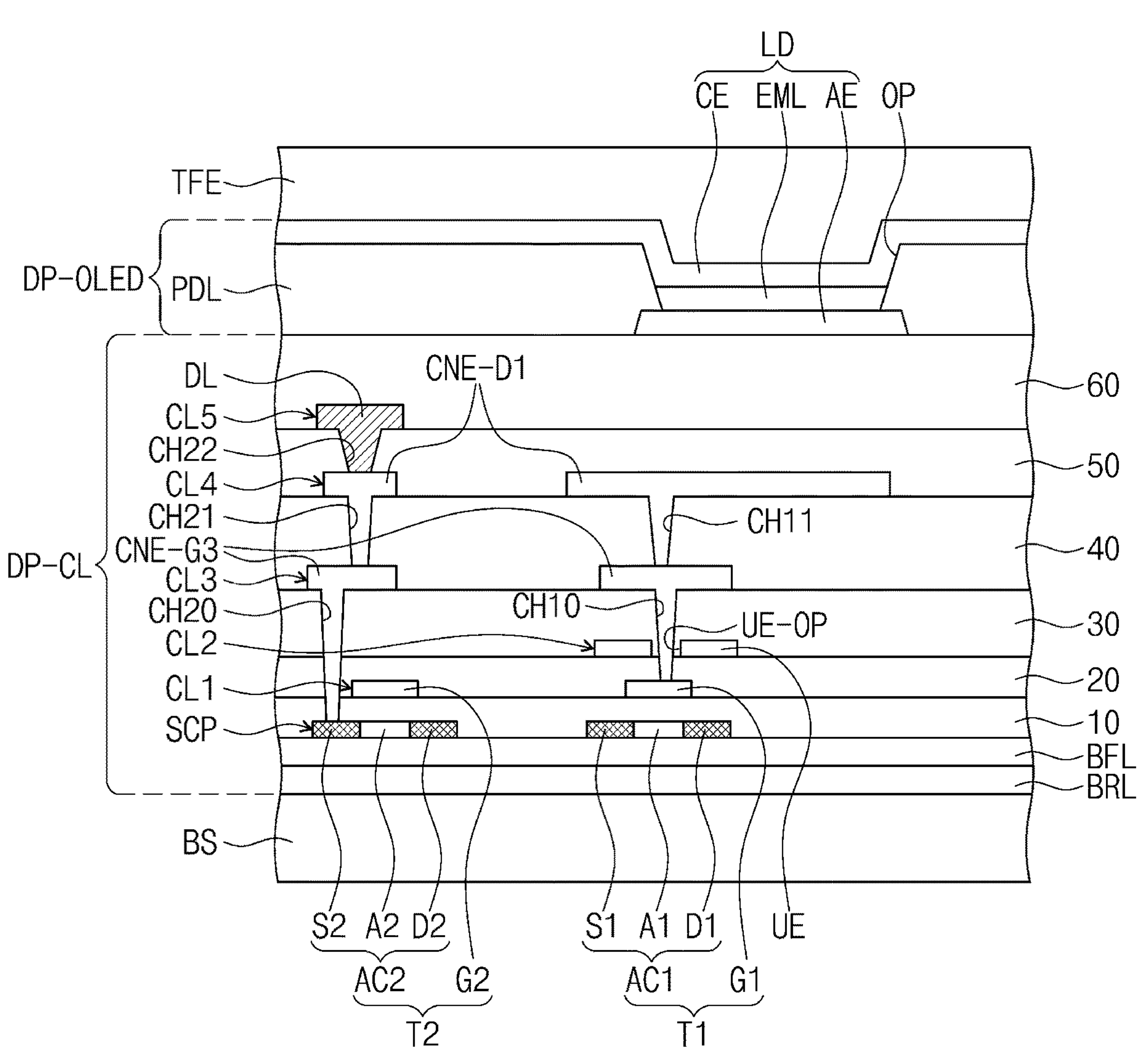
FIG. 4 is a cross-sectional view showing a display panel corresponding to a pixel according to some embodiments of the present disclosure.
Figure 5A:
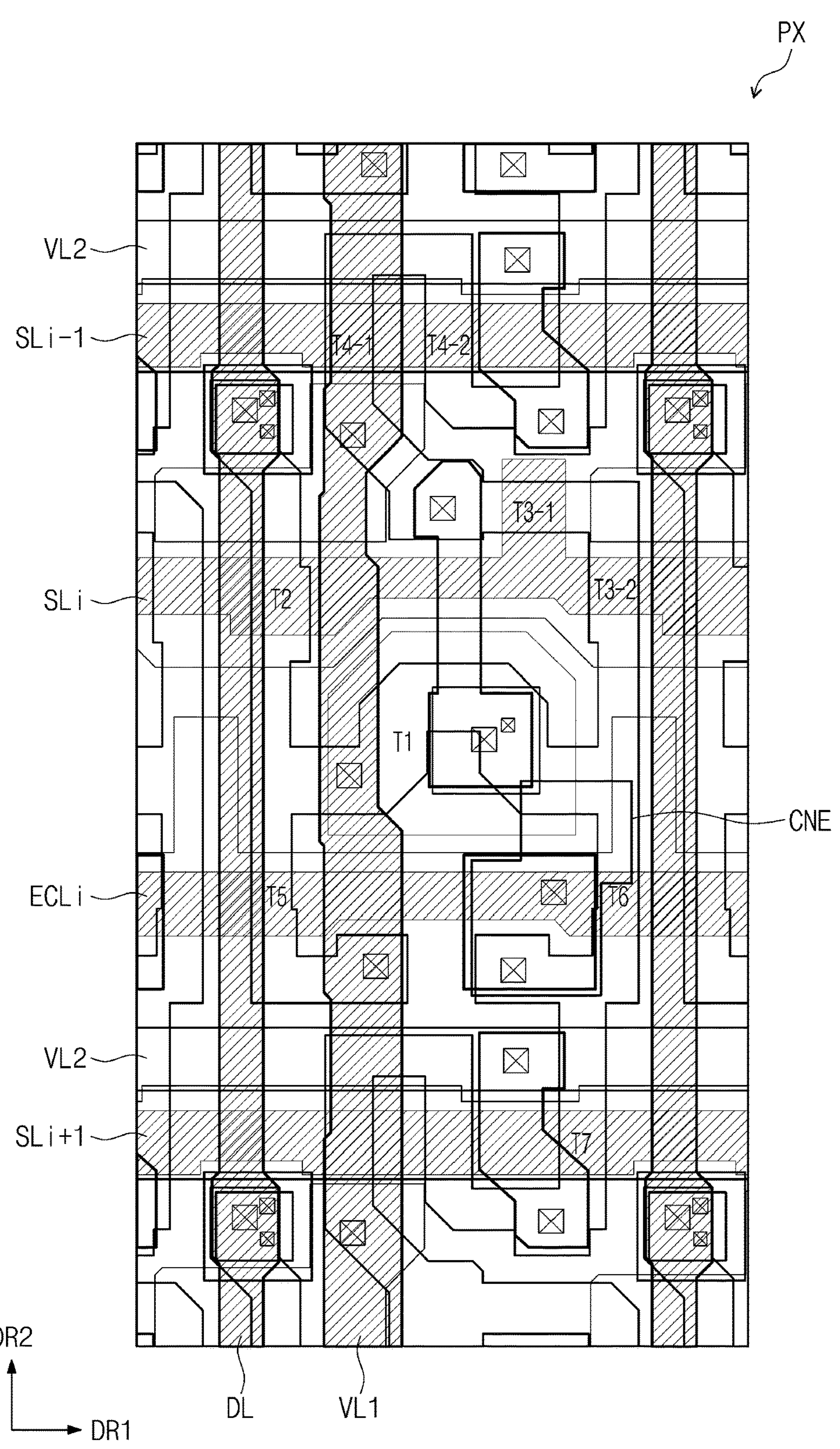
FIG. 5A is a plan view showing a pixel according to some embodiments of the present disclosure.

FIG. 4 is a cross-sectional view showing the display panel corresponding to the pixel PX according to some embodiments of the present disclosure. FIG. 5A is a plan view showing the pixel PX according to some embodiments of the present disclosure. FIGS. 5B to 5G are plan views showing the pixel according to a stack order of patterns included in the pixel.

Referring to FIG. 4, the display panel DP may include a base layer BS, a circuit element layer DP-CL, a display element layer DP-OLED, and a thin film encapsulation layer TFE. The circuit element layer DP-CL, the display element layer DP-OLED, and the thin film encapsulation layer TFE are located on the base layer BS. The display panel DP may further include functional layers, such as an anti-reflective layer and a refractive index control layer. The circuit element layer DP-CL may include at least a plurality of insulating layers and a circuit element. The insulating layers described below may include an organic layer and/or an inorganic layer.

The insulating layer, a semiconductor layer, and a conductive layer may be formed by coating and deposition processes. Then, the insulating layer, the semiconductor layer, and the conductive layer may be selectively patterned by a photolithography process. A semiconductor pattern, a conductive pattern, and the signal line may be formed by the above-mentioned process. Patterns located on the same layer may be formed through the same process.

The base layer BS may include a synthetic resin layer. The synthetic resin layer may include a heat-curable resin. For example, the synthetic resin layer may be a polyimide-based resin layer, and it should not be particularly limited. The synthetic resin layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin. Further, the base layer BS may include a glass substrate, a metal substrate, or an organic/inorganic composite substrate.

At least one inorganic layer may be formed on an upper surface of the base layer BS. The inorganic layer may include at least one of aluminum oxide, titanium oxide, silicon oxide, silicon nitride, silicon oxynitride, zirconium oxide, and hafnium oxide. The inorganic layer may be provided in plural. The inorganic layers may form a barrier layer BRL and/or a buffer layer BFL. The barrier layer BRL and the buffer layer BFL may be selectively located.

The barrier layer BRL may reduce or prevent a foreign substance(s) from entering from the outside. The barrier layer BRL may include a silicon oxide layer and a silicon nitride layer. Each of the silicon oxide layer and the silicon nitride layer may be provided in plural, and the silicon oxide layers and the silicon nitride layers may be alternately stacked with each other.

The buffer layer BFL may improve a coupling force between the base layer BS and the semiconductor pattern and/or the conductive pattern. The buffer layer BFL may include a silicon oxide layer and a silicon nitride layer. The silicon oxide layer and the silicon nitride layer may be alternately stacked with each other.

The semiconductor pattern SCP may be located on the buffer layer BFL. The semiconductor pattern SCP may include amorphous silicon or crystalline silicon semiconductor. As shown in FIG. 4, the semiconductor pattern SCP may include a first semiconductor area AC1 and a second semiconductor area AC2. The first semiconductor area AC1 may include a source area S1, a channel area A1, and a drain area D1 of the first transistor T1, and the second semiconductor area AC2 may include a source area S2, a channel area A2, and a drain area D2 of the second transistor T2. The source and drain of the transistors described in FIG. 2 may be described as a source region and a drain region in describing the semiconductor region.

A first insulating layer 10 may be located on the buffer layer BFL. The first insulating layer 10 may cover the semiconductor pattern SCP. The first insulating layer 10 may be an organic layer or an inorganic layer. Each of second to sixth insulating layers 20 to 60 described later may also be an organic layer or an inorganic layer, and it should not be particularly limited.

A first conductive layer CL1 may be located on the first insulating layer 10. The first conductive layer CL1 may include a plurality of conductive patterns. The first conductive layer CL1 may include the gate G1 of the first transistor T1, and the gate G2 of the second transistor T2.

The second insulating layer 20 may be formed on the first insulating layer 10 to cover the first conductive layer CL1. A second conductive layer CL2 may be located on the second insulating layer 20. The second conductive layer CL2 may include a plurality of conductive patterns. The second conductive layer CL2 may include an upper electrode UE. The upper electrode UE may overlap the gate G1 of the first transistor T1 and may be provided with an opening UE-OP defined therethrough. The upper electrode UE and the gate G1 of the first transistor T1 overlapping the upper electrode UE may define the capacitor CP (refer to FIG. 2).

A third insulating layer 30 may be located on the second insulating layer 20 to cover the second conductive layer CL2. A third conductive layer CL3 may be located on the third insulating layer 30. The third conductive layer CL3 may include a plurality of conductive patterns. The third conductive layer CL3 may include a connection electrode CNE-G3. One connection electrode CNE-G3 may be connected to the gate G1 of the first transistor T1 via a contact hole CH10 defined through the second insulating layer 20 and the third insulating layer 30. The contact hole CH10 may pass through the opening UE-OP. The other connection electrode CNE-G3 may be connected to the source area S2 of the second transistor T2 via a contact hole CH20 defined through the first insulating layer 10, the second insulating layer 20, and the third insulating layer 30. The third conductive layer CL3 may further include a plurality of connection electrodes in some embodiments.

A fourth insulating layer 40 may be located on the third insulating layer 30 to cover the third conductive layer CL3. A fourth conductive layer CL4 may be located on the fourth insulating layer 40. The fourth conductive layer CL4 may include a plurality of conductive patterns. The fourth conductive layer CL4 may include connection electrodes CNE-D1. The connection electrodes CNE-D1 may be connected to corresponding connection electrodes CNE-G3, respectively, via contact holes CH11 and CH21 defined through the fourth insulating layer 40.

A fifth insulating layer 50 may be located on the fourth insulating layer 40 to cover the fourth conductive layer CL4. A fifth conductive layer CL5 may be located on the fifth insulating layer 50. The fifth conductive layer CL5 may include a plurality of conductive patterns. The fifth conductive layer CL5 may include the data line DL. The data line DL may be connected to a corresponding connection electrode CNE-D1 via a contact hole CH22 defined through the fifth insulating layer 50.

A sixth insulating layer 60 may be located on the fifth insulating layer 50 to cover the fifth conductive layer CL5. The light emitting element LD may be located on the sixth insulating layer 60. A first electrode AE of the light emitting element LD may be located on the sixth insulating layer 60. The first electrode AE may be the anode. A pixel definition layer PDL may be located on the sixth insulating layer 60.

The pixel definition layer PDL may be provided with an opening OP defined therethrough to expose at least a portion of the first electrode AE. The opening OP of the pixel definition layer PDL may define a light emitting area. A light emitting layer EML may be located on the first electrode AE. In some embodiments, the patterned light emitting layer EML is shown as a representative example, however, the light emitting layer EML may be commonly located in the pixels PX (refer to FIG. 1). The light emitting layer EML commonly located may generate a white light or a blue light, for example. In addition, the light emitting layer EML may have a multi-layer structure.

In some embodiments, a hole transport layer may be further located between the first electrode AE and the light emitting layer EML. A hole injection layer may be further located between the hole transport layer and the first electrode AE. The hole transport layer or the hole injection layer may be commonly located in the pixels PX (refer to FIG. 1).

A second electrode CE may be located on the light emitting layer EML. In some embodiments, an electron transport layer may be further located between the second electrode CE and the light emitting layer EML. An electron injection layer may be further located between the electron transport layer and the second electrode CE. The electron transport layer or the electron injection layer may be commonly located in the pixels PX (refer to FIG. 1).

The thin film encapsulation layer TFE may be located on the second electrode CE. The thin film encapsulation layer TFE may be commonly located in the pixels PX (refer to FIG. 1). In some embodiments, the thin film encapsulation layer TFE may directly cover the second electrode CE. According to some embodiments, a capping layer that directly covers the second electrode CE may be further located. The thin film encapsulation layer TFE may include at least an inorganic layer or organic layer. According to some embodiments, the thin film encapsulation layer TFE may include two inorganic layers and an organic layer located between the two inorganic layers. According to some embodiments, the thin film encapsulation layer may include a plurality of inorganic layers and a plurality of organic layers alternately stacked with the inorganic layers.

Referring to FIG. 5A, the first to seventh transistors T1 to T7 of the pixel PX are shown. In addition, the scan signal lines SLi−1, SLi, and SLi+1, the emission control line ECLi, the first voltage line VL1, and the second voltage line VL2 are shown.

Figure 5B:
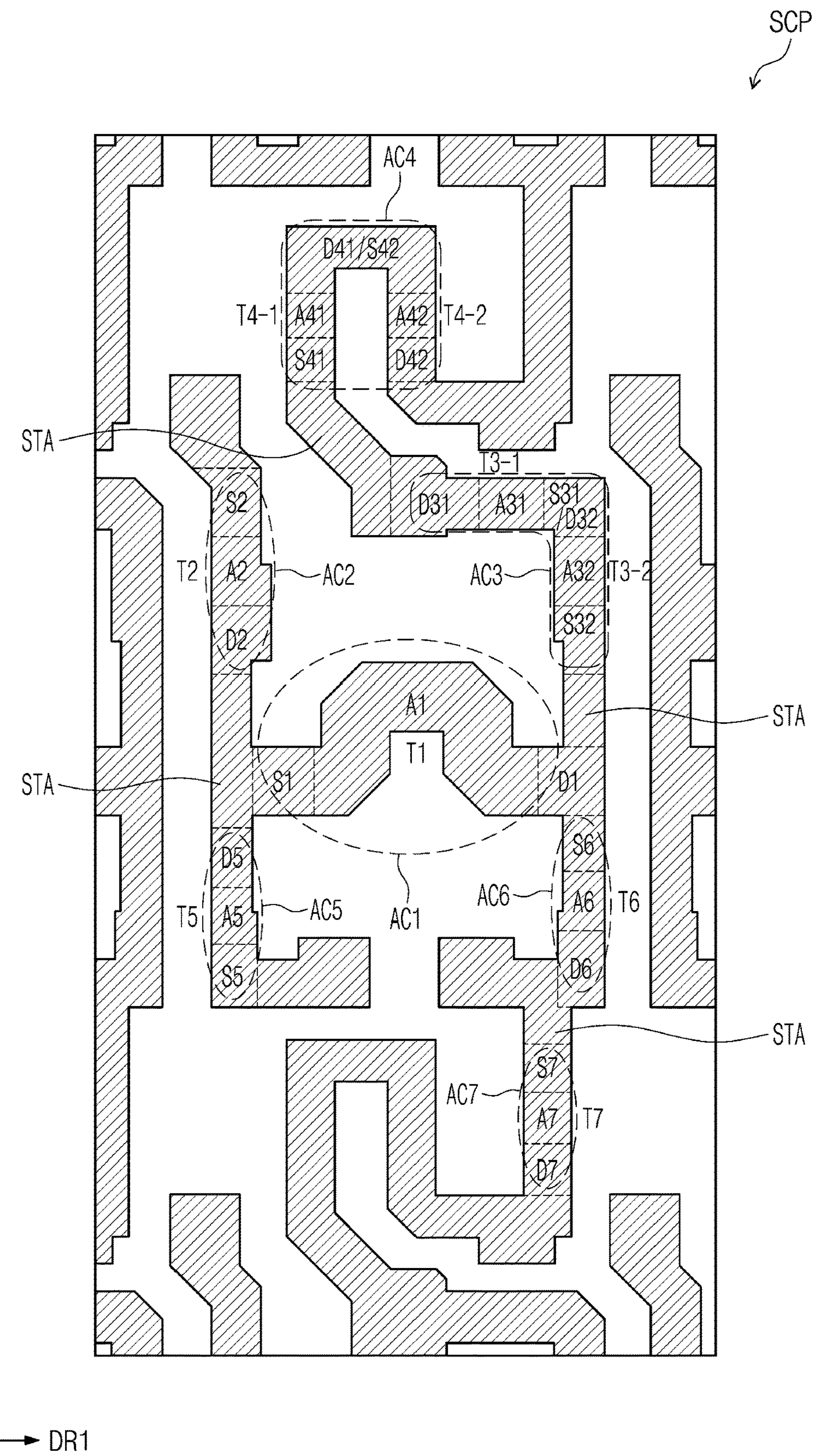
FIGS. 5B to 5G are plan views showing the pixel according to a stack order of patterns included in the pixel.

Referring to FIG. 5B, a semiconductor pattern SCP may be located on the base layer BS (refer to FIG. 4). The semiconductor pattern SCP may include first to seventh semiconductor areas AC1 to AC7 respectively corresponding to the first to seventh transistors T1 to T7 (refer to FIG. 2).

Each of the first to seventh semiconductor areas AC1 to AC7 may include a corresponding source area among the source areas S1 to S7, a corresponding channel area among the channel areas A1 to A7, and a corresponding drain area among the drain areas D1 to D7. The source areas S1 to S7 and the drain areas D1 to D7 may have a high doping concentration, and may substantially have a conductivity, and the channel areas A1 to A7 may have a low doping concentration and may be located between respective source areas S1 to S7 and respective drain areas D1 to D7. Substantially, the source and the drain of each of the first to seventh transistors T1 to T7 may be defined by the source areas S1 to S7 and the drain areas D1 to D7 of the first to seventh semiconductor areas AC1 to AC7.

The first to seventh semiconductor areas AC1 to AC7 may be provided integrally with each other. Among the first to seventh semiconductor areas AC1 to AC7, the respective source areas S1 to S7 and drain areas D1 to D7 of the semiconductor areas adjacent to each other may not be distinguished from each other. In FIG. 5B, for the convenience of explanation, the source areas S1 to S7 and the drain areas D1 to D7 of the semiconductor areas adjacent to each other are shown to be distinguished from each other. In addition, a structure in which a signal cutoff area STA is located between the source areas S1 to S7 and the drain areas D1 to D7 of different semiconductor areas among the first to seventh semiconductor areas AC1 to AC7 is shown, however, the present disclosure should not be limited thereto or thereby. The signal cutoff area STA may be an area having substantially the same doping concentration as that of the source areas S1 to S7 or the drain areas D1 to D7.

Figure 5C:
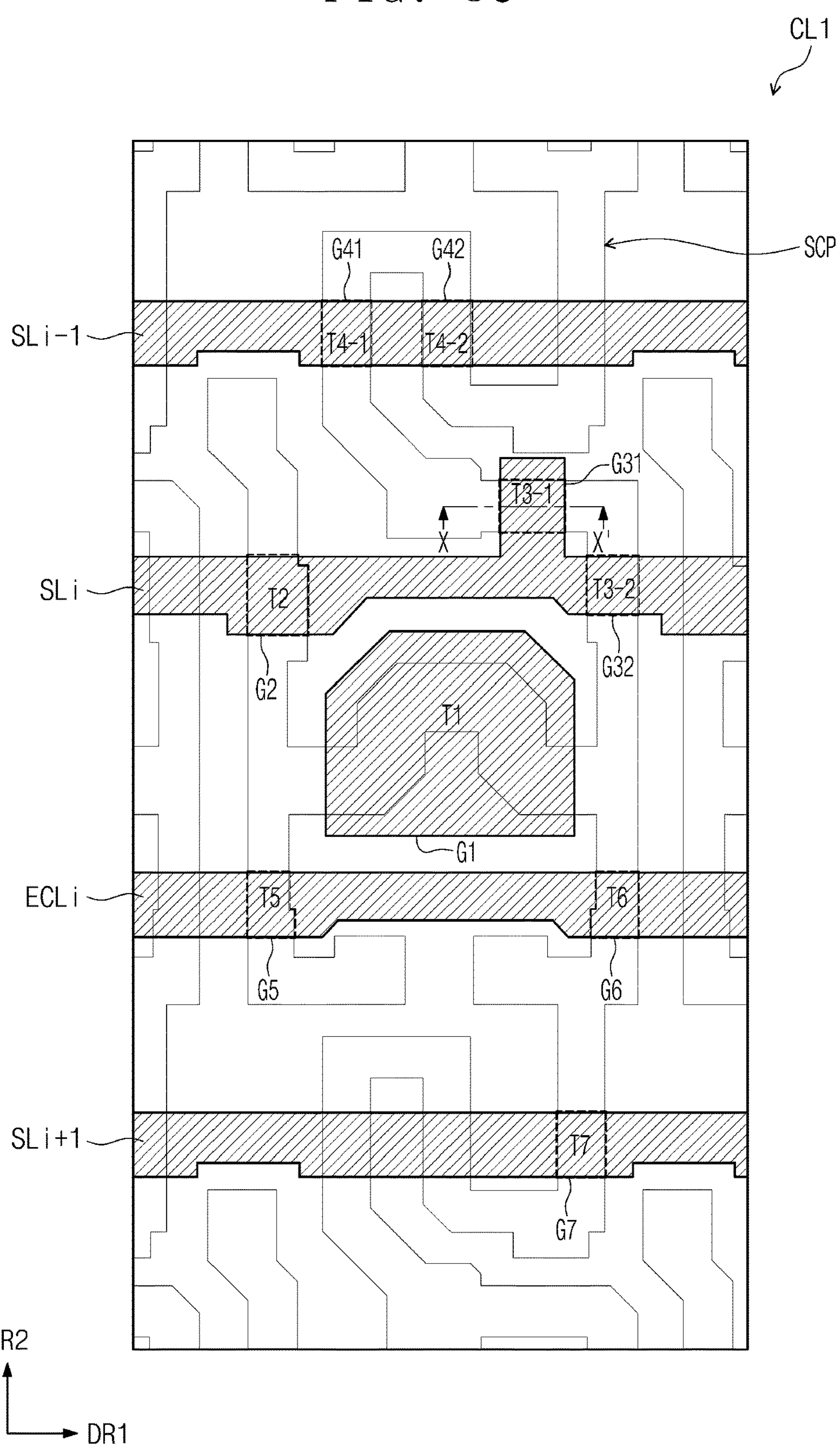

Referring to FIG. 5C, the first conductive layer CL1 may be located on the first insulating layer 10 (refer to FIG. 4). The first conductive layer CL1 may include the scan signal lines SLi−1, SLi, and SLi+1, the emission control line ECLi, and the first gate G1. Each of the scan signal lines SLi−1, SLi, and SLi+1, the emission control line ECLi is extend in the first direction DR1.

A portion of the i-th scan signal line SLi overlapping the semiconductor pattern SCP may be the gate G2 of the second transistor T2, another portion of the i-th scan signal line SLi overlapping the semiconductor pattern SCP may be the gate G31 of one third transistor T3-1, and the other portion of the i-th scan signal line SLi overlapping the semiconductor pattern SCP may be the gate G32 of the other third transistor T3-2.

FIG. 5C shows the gates G41 and G42 of the fourth transistors T4-1 and T4-2 located in the (i−1)th scan signal line SLi−1, the gate G7 of the seventh transistor T7 located in the (i+1)th scan signal line SLi+1, and the gate G5 of the fifth transistor T5 and the gate G6 of the sixth transistor T6 located in the i-th emission control line ECLi.

Figure 5D:
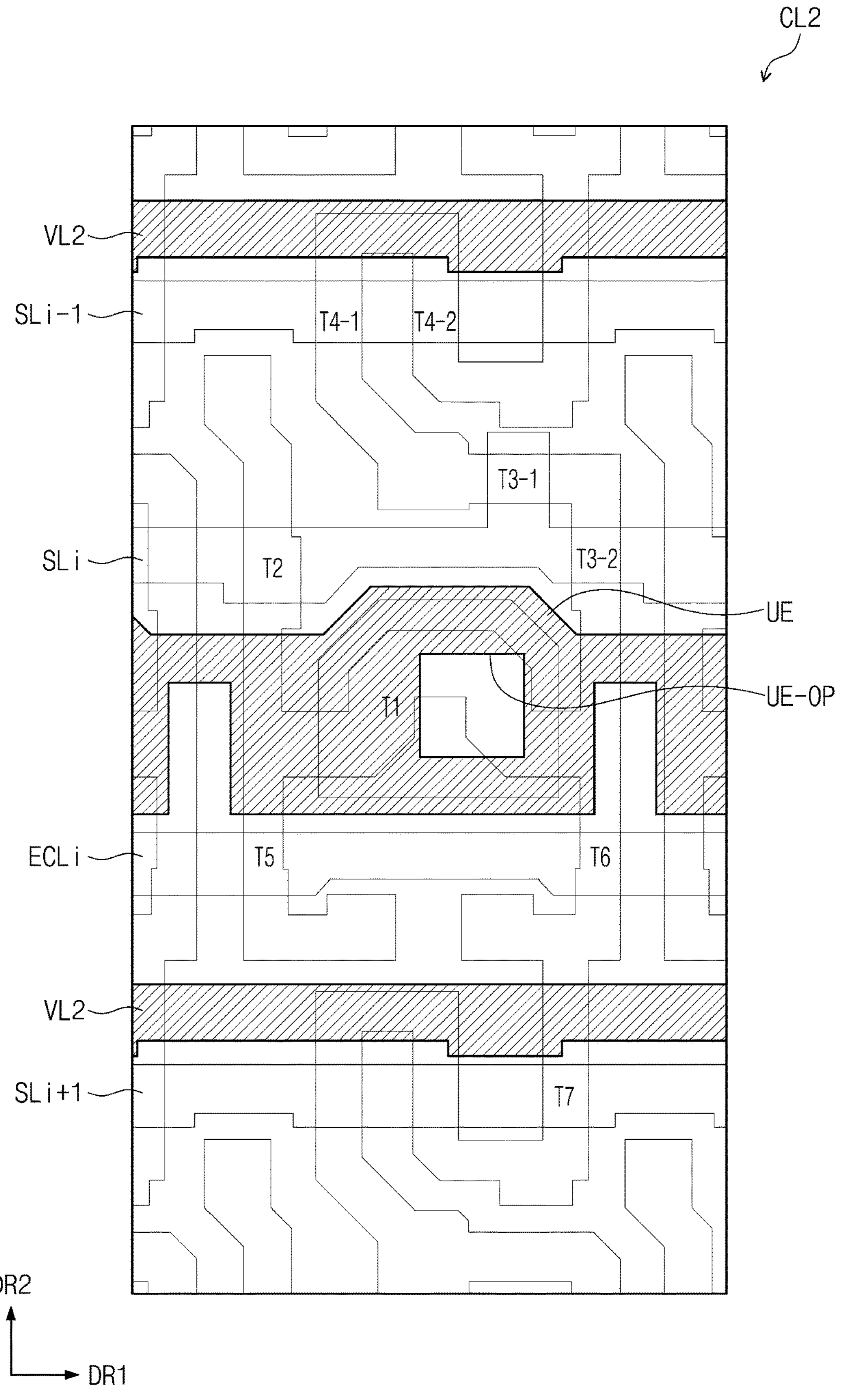

Referring to FIG. 5D, the second conductive layer CL2 may be located on the second insulating layer 20 (refer to FIG. 4). The second conductive layer CL2 may include the upper electrode UE and the second voltage line VL2. The second voltage line VL2 may extend in the first direction DR1. The second conductive layer CL2 may include a plurality of second voltage lines VL2, and the second voltage lines VL2 may be arranged in the second direction DR2.

Figure 5E:
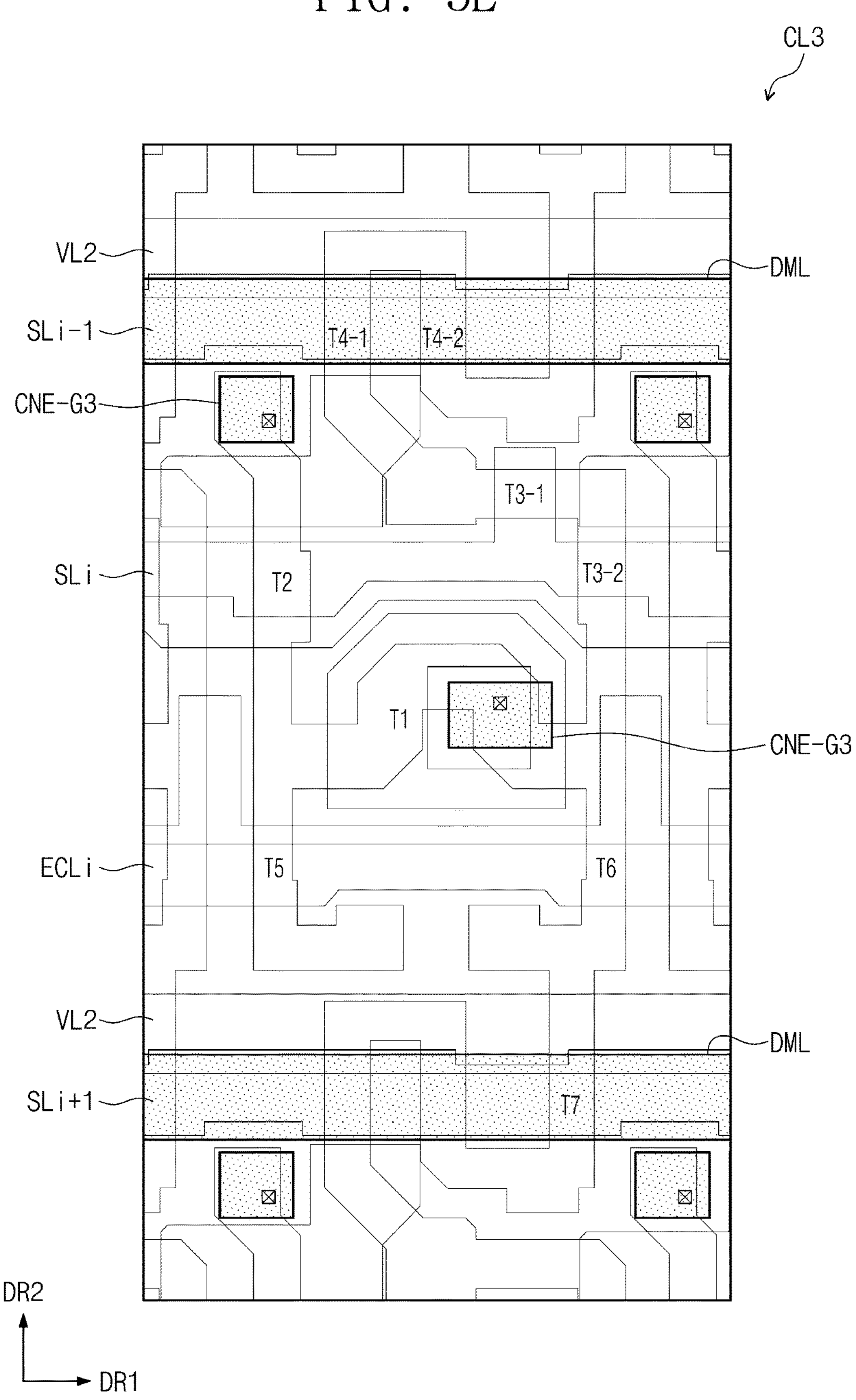

Referring to FIG. 5E, the third conductive layer CL3 may be located on the third insulating layer 30 (refer to FIG. 4). The third conductive layer CL3 may include the connection electrode CNE-G3 described with reference to FIG. 4.

The third conductive layer CL3 may further include a dummy line DML. The dummy line DML may extend in the first direction DR1. The third conductive layer CL3 may include a plurality of dummy lines DML, and the dummy lines DML may be arranged in the second direction DR2. The dummy lines DML shown are merely one example, and the dummy lines DML may extend in the second direction DR2 in some embodiments.

The dummy lines DML may receive a ground voltage or may be floated. According to some embodiments, the dummy lines DML may be electrically connected to the second voltage lines VL2 shown in FIG. 5D. According to some embodiments, the dummy lines DML may be electrically connected to a plurality of first voltage lines VL1 shown in FIG. 5F, which is described later.

Figure 5F:
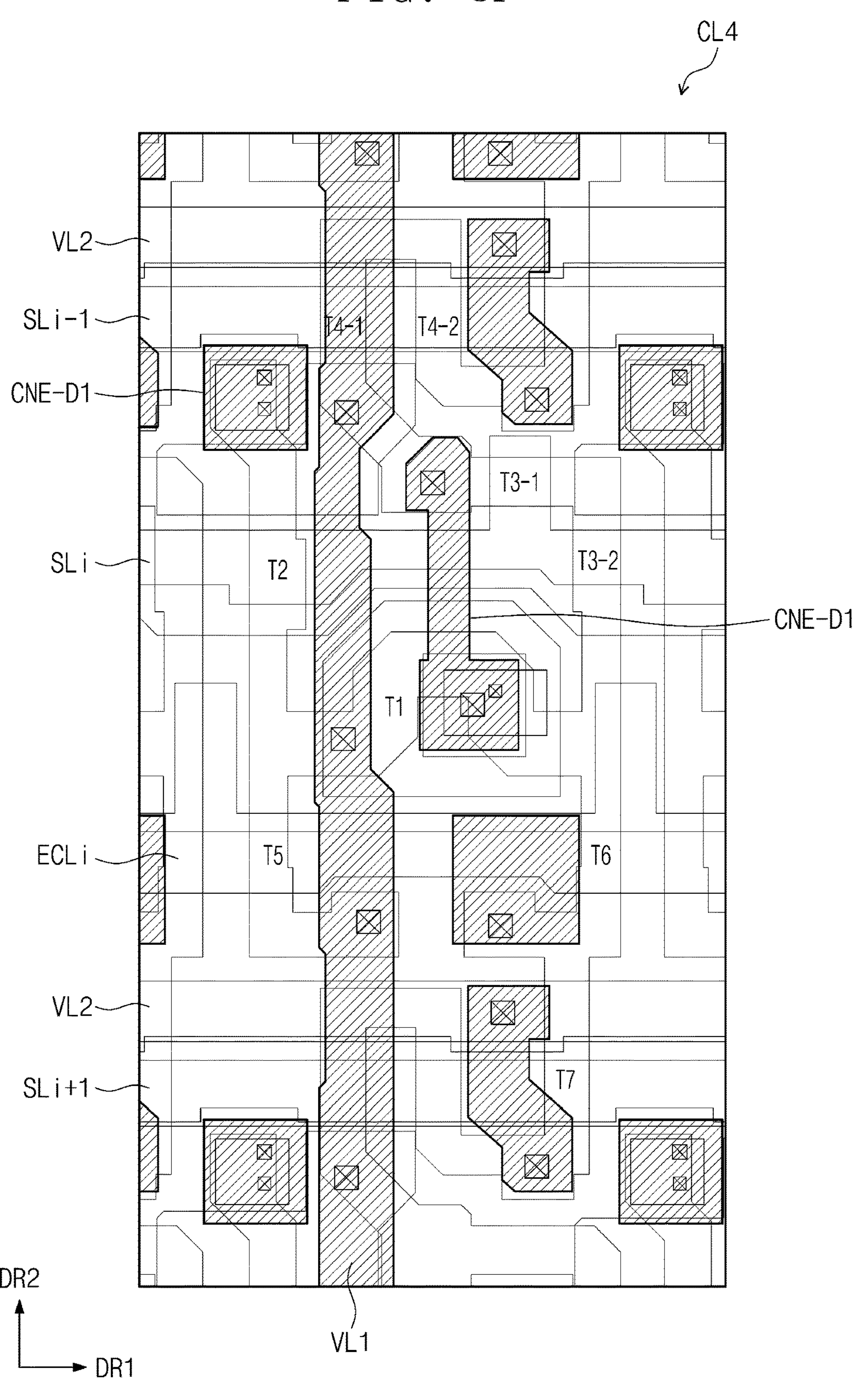

Referring to FIG. 5F, the fourth conductive layer CL4 may be located on the fourth insulating layer 40 (refer to FIG. 4). The fourth conductive layer CL4 may include the first voltage line VL1 and the connection electrodes. The connection electrodes may include the connection electrodes CNE-D1 described with reference to FIG. 4.

Figure 5G:
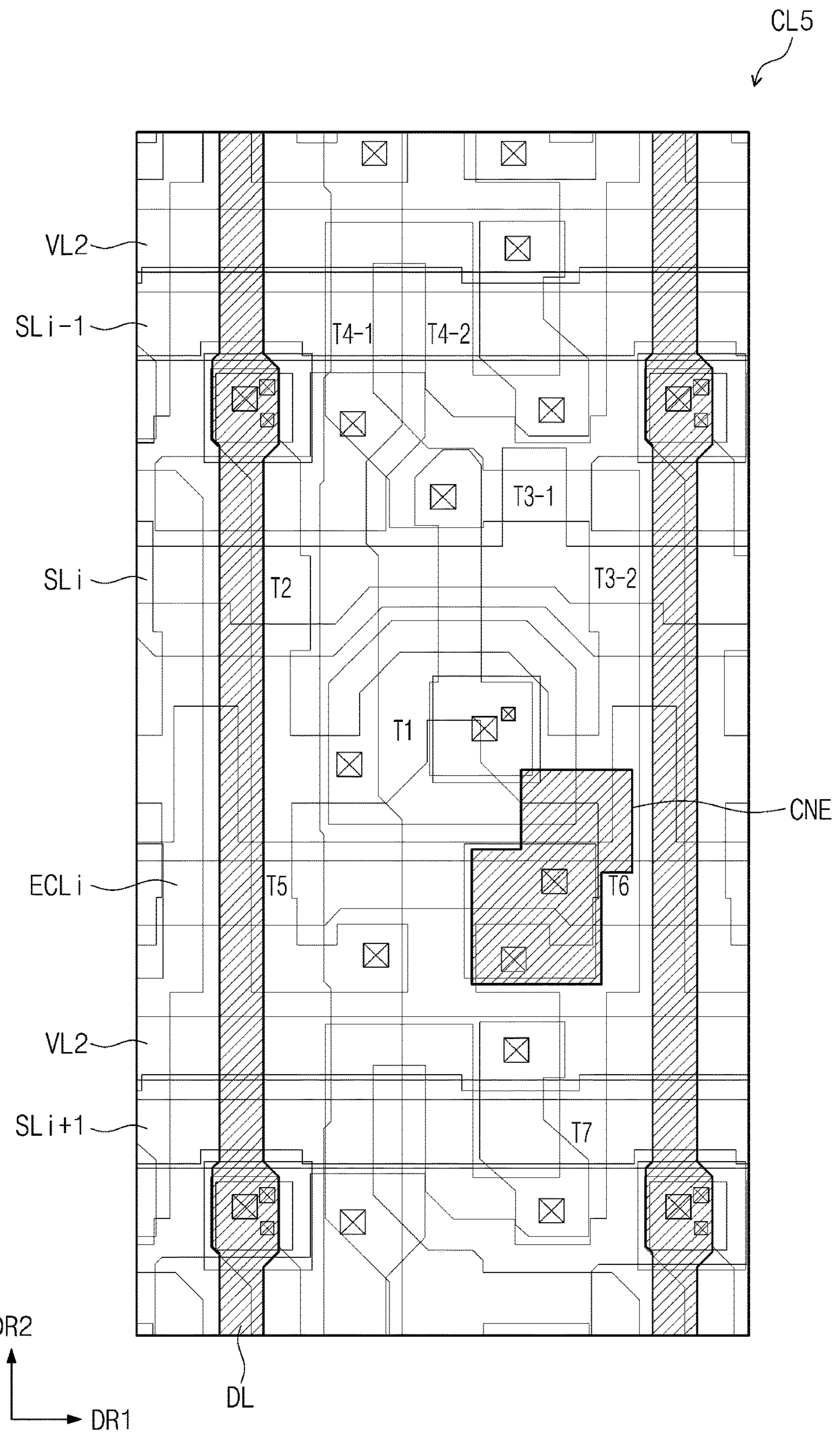

Referring to FIG. 5G, the fifth conductive layer CL5 may be located on the fifth insulating layer 50 (refer to FIG. 4). The fifth conductive layer CL5 may include the data line DL and the connection electrode CNE. The first electrode AE of FIG. 4 may be connected to the connection electrode CNE of FIG. 5G.

Figure 6A:
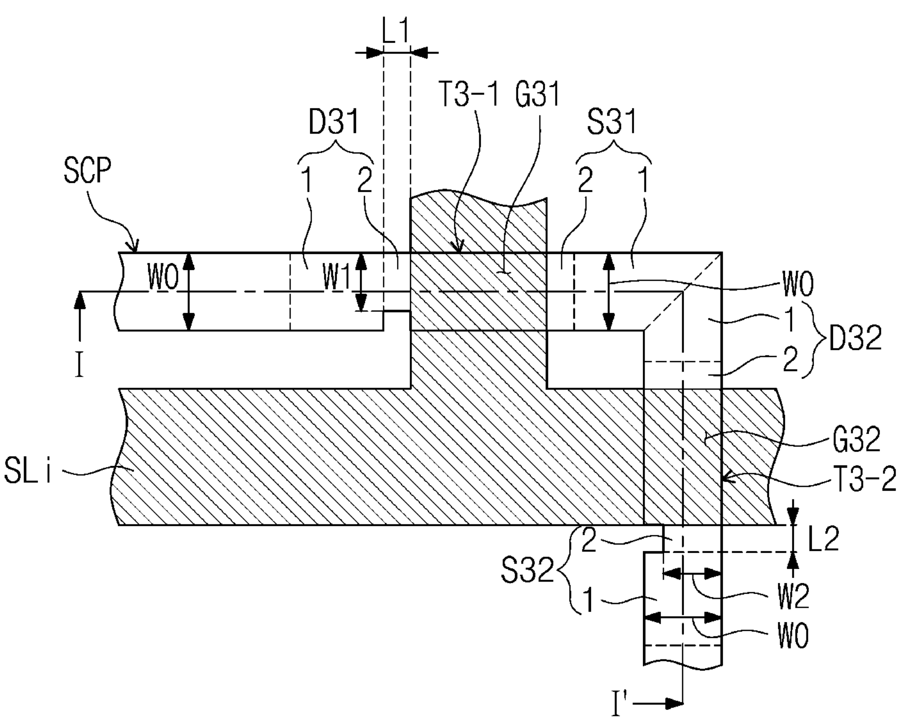
FIG. 6A is a plan view showing third transistors according to some embodiments of the present disclosure.
Figure 6B:
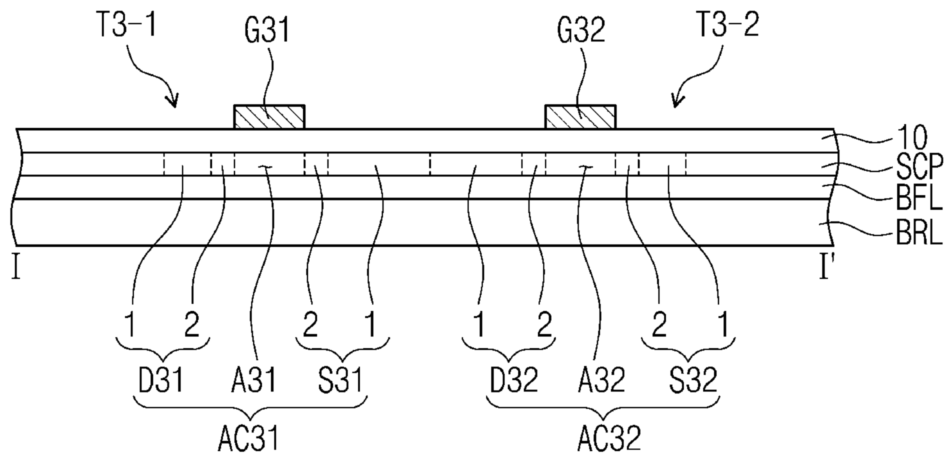
FIGS. 6B and 6C are cross-sectional views taken along the line I-I' of FIG. 6A to show the third transistors.
Figure 6C:
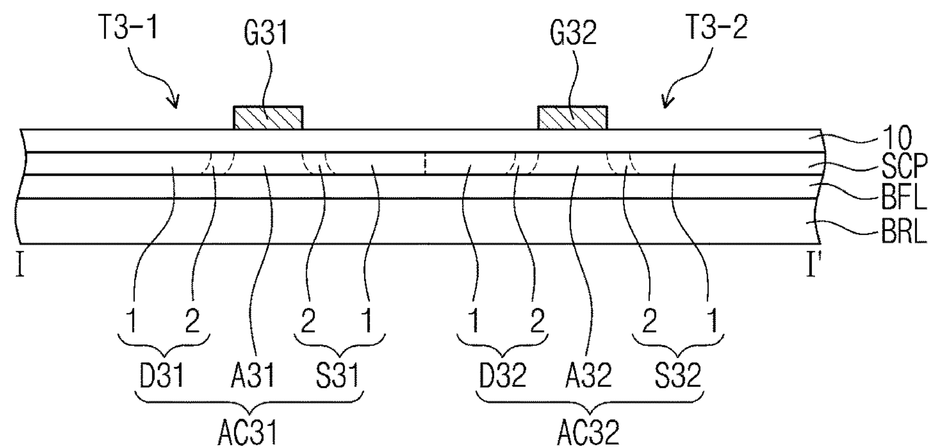
Figure 6D:
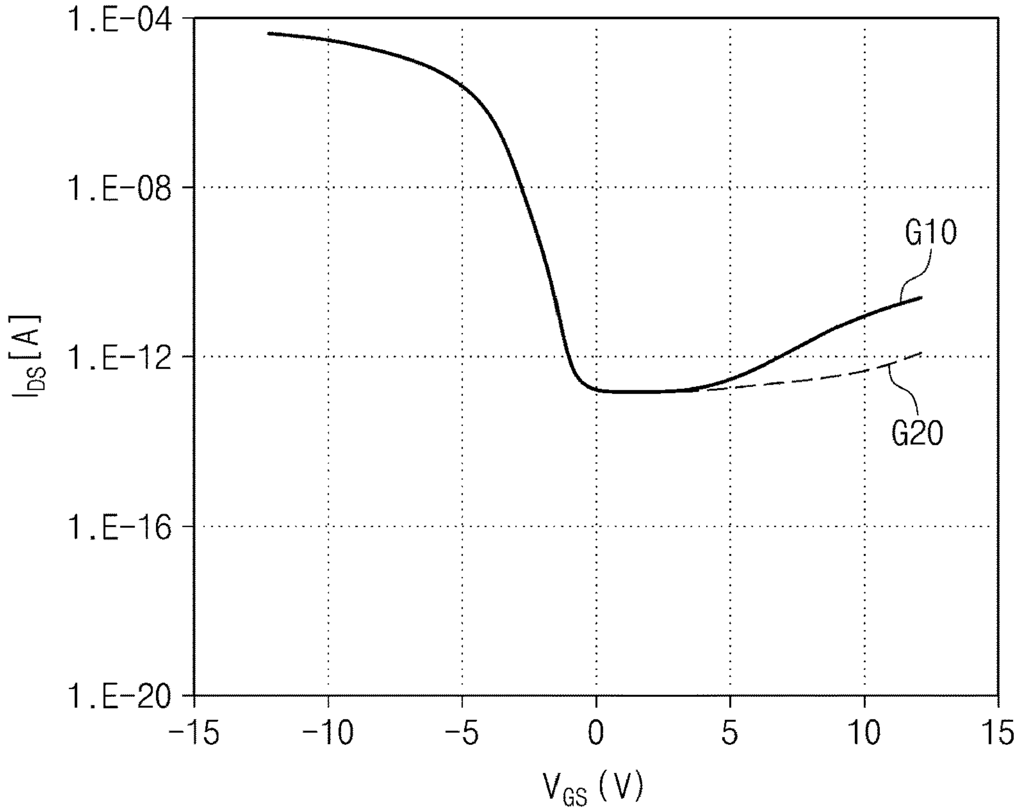
FIG. 6D is a graph showing a voltage-current relation of a transistor according to a comparative example and a transistor according to some embodiments of the present disclosure.

FIG. 6A is a plan view showing the third transistors T3-1 and T3-2 according to some embodiments of the present disclosure. FIGS. 6B and 6C are cross-sectional views taken along the line I-I' of FIG. 6A to show the third transistors T3-1 and T3-2. FIG. 6D is a graph showing a voltage ($V_{GS}$)-current ($I_{DS}$) relation of a transistor according to a comparative example and a transistor according to some embodiments of the present disclosure. FIG. 6E is a cross-sectional view showing a doping process of the transistor T3-1. FIG. 6F is a circuit diagram showing an operation of the first transistor T1 and the third transistors T3-1 and T3-2 in a light emitting period corresponding to a data signal with high grayscale. FIG. 6G is a circuit diagram showing an operation of the first transistor T1 and the third transistors T3-1 and T3-2 in a light emitting period corresponding to a data signal with intermediate grayscale.

FIG. 6A is an enlarged plan view showing the third transistors T3-1 and T3-2 shown in FIGS. 2 and 5A to 5G. Referring to FIGS. 6A and 6B, among the two third transistors T3-1 and T3-2, the third transistor T3-1 located closer to the gate of the first transistor T1 (refer to FIG. 2) in a current path is defined as a left transistor T3-1, and the third transistor T3-2 located further away from the gate of the first transistor T1 (refer to FIG. 2) is defined as a right transistor T3-2. Referring to FIG. 6B, the semiconductor region AC31 of the left transistor T3-1 and the semiconductor region AC32 of the right transistor T3-2 are illustrated in the semiconductor pattern SCP.

Referring to FIGS. 6A and 6B, because the third transistors T3-1 and T3-2 are the P-type transistor as described above, the drain area D31 of the left transistor T3-1 may be located closer to the gate of the first transistor T1 (refer to FIG. 2) than the source area S31 of the left transistor T3-1, and the drain area D32 of the right transistor T3-2 may be located closer to the gate of the first transistor T1 (refer to FIG. 2) than the source area S32 of the right transistor T3-2.

Each of the drain areas D31 and D32 and the source areas S31 and S32 of the third transistors T3-1 and T3-2 may include a high-doped area 1 with a relatively high doping concentration, and a low-doped area 2 with a relatively low doping concentration. The low-doped area 2 may be located between the high-doped area 1 and a corresponding channel area of the channel areas A31 and A32.

Hereinafter, the high-doped area 1 of each of the drain areas D31 and D32 and the source areas S31 and S32 may be referred to as a first area, and the low-doped area 2 of each of the drain areas D31 and D32 and the source areas S31 and S32 may be referred to as a second area. When the high-doped area 1 and the low-doped area 2 of one of the drain areas D31 and D32 and the source areas S31 and S32 are referred to as the first area and the second area, respectively, the high-doped area 1 and the low-doped area 2 of the other of the drain areas D31 and D32 and the source areas S31 and S32 may be referred to as a third area and a fourth area, respectively, to distinguish the high-doped areas 1 from each other or the low-doped areas 2 from each other.

The first area 1 may have a doping concentration of about $1\times10^{20}/cm^2$. The second area 2 may have a doping concentration that is about 5% to about 20% of the doping concentration of the first area 1. Meanwhile, because the gates G31 and G32 of the third transistors T3-1 and T3-2 serve as a mask, the channel areas A31 and A32 may have a very low doping concentration.

According to some embodiments, in contrast to the embodiments shown in FIGS. 6A and 6B, each of the source area S31 of the left transistor T3-1 and the drain area D32 of the right transistor T3-2 may omit the second area 2. The doping concentration of the first area 1 and the second area 2 may be determined according to the doping method, and thus, the doping concentration of the source area S31 of the left transistor T3-1 and the doping concentration of the drain area D32 of the right transistor T3-2 may be controlled to be the same as each other.

For instance, an additional doping may be performed on the second area 2 of each of the source area S31 of the left transistor T3-1 and the drain area D32 of the right transistor T3-2 to remove the second area 2. According to some embodiments, a difference in doping concentration between the first area 1 and the second area 2 may be controlled to be relatively low considering the doping concentration of the first area 1 and the second area 2 by increasing the doping concentration of the source area S31 of the left transistor T3-1 and the drain area D32 of the right transistor T3-2.

As shown in FIG. 6B, a boundary line between the first area 1, the second area 2, and the channel areas A31 and A32 may be a straight line in a cross-section, however, the boundary line between the first area 1, the second area 2, and the channel areas A31 and A32 may be a curved line in the cross-section as shown in FIG. 6C. In FIG. 6C, the doping concentration of the second area 2 adjacent to the channel areas A31 and A32 may have a Gaussian distribution according to a linear distance from an upper surface of the semiconductor pattern SCP.

The second area 2 may reduce or prevent the likelihood of an electric field rapidly increasing between the channel areas A31 and A32 and the drain areas D31 and D32, or between the channel areas A31 and A32 and the source areas S31 and S32 (hereinafter, referred to as a drain/source field reduction effect). Accordingly, an off current (or a leakage current) of the third transistors T3-1 and T3-2 may be reduced, and a hot carrier effect (HCE) caused when as a length of the channel areas A31 and A32 decreases may be reduced or suppressed.

FIG. 6D shows an off current of transistors with or without the second area 2. A first graph G10 represents voltage ($V_{GS}$)-current ($I_{DS}$) characteristics of a transistor according to the comparative example in which the second area 2 is not formed, and a second graph G20 represents voltage ($V_{GS}$)-current ($I_{DS}$) characteristics of a transistor according to some embodiments in which the second area 2 is formed. It is observed that the leakage current of the P-type transistor according to some embodiments is reduced in a period where a gate-source voltage $V_{GS}$ is about 5V or more.

This is because a gate induced drain leakage current $I_{GIDL}$ is reduced due to the drain/source field reduction effect. The leakage current $I_{GIDL}$ may be represented by the following equation, and the leakage current $I_{GIDL}$ may be reduced due to a reduction of a drain-gate field.

$$I_{GIDL} \cong W\frac{(DL)_{eff}}{2}\cdot\frac{\pi q^2\cdot m_P^*\cdot E_G\cdot V_{BD}}{h^3}\cdot\frac{E_x(DL)}{\frac{\pi^2\cdot\sqrt{2m_P^*}\cdot E_G^{2/3}}{2q\cdot h}}\cdot\exp\left(-\frac{\pi^2\cdot\sqrt{m_p^*}\cdot E_G^{2/3}}{2q\cdot h\cdot E_{x(DL)}}\right)$$

The second area 2 may suitably have a resistance (e.g., a predetermined resistance) to generate the drain/source field reduction effect. The resistance of the second area 2 may be inversely proportional to a thickness, may be proportional to a length, and may be inversely proportional to a width. The resistance of the second areas 2 may be controlled by adjusting the length and the width of the second areas in the semiconductor pattern SCP with an integral shape, for example.

As shown in FIGS. 6A and 6B, the resistance of the second areas 2 may be controlled by changing the width. A width W1 of the second area 2 of the drain area D31 of the left transistor T3-1 may be smaller than a width W0 of the first area 1 of the drain area D31 of the left transistor T3-1. A width W2 of the second area 2 of the source area S32 of the right transistor T3-2 may be smaller than a width W0 of the first area 1 of the source area S32 of the right transistor T3-2. The width is measured in a reference direction substantially perpendicular to an extension direction of the semiconductor pattern SCP. Meanwhile, the length is measured in the extension direction of the semiconductor pattern SCP.

When assuming that the length of the second areas 2 is uniform, a relatively large drain/source field reduction effect may occur in the second area 2 of the drain area D31 of the left transistor T3-1 and the second area 2 of the source area S32 of the right transistor T3-2. When the length of the second area 2 is smaller than a reference value, a portion of the second area 2 may have a relatively small resistance, and the drain/source field reduction effect may not occur in the second area 2 having the relatively small resistance. Although the second areas 2 have the uniform length, the portion of the second area 2 may have a relatively large resistance because it has a relatively small width. The drain/source field reduction effect may occur in the second area 2 with the relatively small width. For instance, because each of the second area 2 of the drain area D31 of the left transistor T3-1 and the second area 2 of the source area S32 of the right transistor T3-2 have the large resistance due to the relatively small widths W1 and W2, the drain/source field reduction effect may occur.

In the source area S31 of the left transistor T3-1, the width W0 of the first area 1 and the width W0 of the second area 2 may be the same as each other, and in the drain area D32 of the right transistor T3-2, the width W0 of the first area 1 and the width W0 of the second area 2 may be the same as each other. The width W0 of the source area S31 of the left transistor T3-1 may be substantially the same as the width W0 of the drain area D32 of the right transistor T3-2. The drain/source field reduction effect may not occur in the source area S31 of the left transistor T3-1 and the drain area D32 of the right transistor T3-2, when having a relatively large width W0.

The width W1 of the second area 2 of the drain area D31 of the left transistor T3-1 and the width W2 of the second area 2 of the source area S32 of the right transistor T3-2 may be within a range from about 1 μm to about 2 μm. Each of the widths W1 and W2 of the second areas 2 may be about 1.5 μm. The width W1 of the second area 2 of the drain area D31 of the left transistor T3-1 and the width W2 of the second area 2 of the source area S32 of the right transistor T3-2 should not be limited to having the same value. The width W1 of the second area 2 of the drain area D31 of the left transistor T3-1 and the width W2 of the second area 2 of the source area S32 of the right transistor T3-2 may be about 10% to about 50% less than the width W0 of the first areas 1.

FIG. 6E shows a doping process according to some embodiments. According to some embodiments, the semiconductor area AC3 of the transistor T3-1 may be doped using the gate G31 as a mask after the second insulating layer 20 is formed. As an example, the semiconductor area AC3 of the transistor T3-1 may be doped at a doping concentration of about $1\times10^{15}/cm^3$.

FIG. 6E shows a cross-section taken along the line X-X' of FIG. 5C as a representative example. The first, second, and fourth to seventh semiconductor areas AC1, AC2, and AC4 to AC7 may also be doped by the method shown in FIG. 6E or may be doped using an additional mask, and the doping method should not be particularly limited.

Referring to FIG. 6E, the second insulating layer 20 may be located along a sloped side surface of the gate G31. An area (hereinafter, referred to as a slope area) corresponding to the sloped side surface of the gate G31 of the second insulating layer 20 may have a larger thickness than an area corresponding to a flat surface of the second insulating layer 20 with respect to an upper surface of the first insulating layer 10. A distance DT2 between an upper surface of the second insulating layer 20 and the semiconductor area AC3 in the slope area of the second insulating layer 20 may be greater than a distance DT1 between the upper surface of the second insulating layer 20 and the semiconductor area AC3 in a plane area/flat area of the second insulating layer 20. The slope area may correspond to area that interferes with doping, and this may serve as a mask pattern.

The second area 2 of each of the drain area D31 and the source area S31 may be defined to correspond to the slope area of the second insulating layer 20. A length of the slope area (e.g., a length of the second area 2) may be determined according to a thickness of the gate G31. In some embodiments, the thickness of the gate G31 may be within a range from about 3000 angstroms to about 5000 angstroms.

A length L1 of the second area 2 of the drain area D31 of the left transistor T3-1 and a length L2 of the second area 2 of the source area S32 of the right transistor T3-2 may be within a range from about 0.1 μm to about 0.5 μm. The length L1 of the second area 2 of the drain area D31 of the left transistor T3-1 and the length L2 of the second area 2 of the source area S32 of the right transistor T3-2 should not be limited to having the same value. A length of the left second area 2 of the source area S31 of the left transistor T3-1 and a length of the second area 2 of the drain area D32 of the right transistor T3-2 may be within a range of the lengths L1 and L2 of the second areas 2 according to the doping process.

Hereinafter, an operation of the first transistor T1 and the third transistors T3-1 and T3-2 in the light emitting period corresponding to the data voltage with high grayscale will be described with reference to FIG. 6F.

The gate G1 of the first transistor T1 may have a voltage of about 1V to correspond to the high grayscale data voltage charged in the capacitor CP (refer to FIG. 2). In this case, the drain D1 of the first transistor T1 may have a voltage of about 2V. The source S32 of the right transistor T3-2 may have a voltage of about 2V. During the light emitting period, the third transistors T3-1 and T3-2 may be turned off, but a leakage current flowing from the source S32 of the right transistor T3-2 to the drain D31 of the left transistor T3-1 may occur. Further, when the third transistors T3-1 and T3-2 are switched to the turned-off state from the turned-on state, a voltage of intermediate nodes S31/D32 of the right transistor T3-2 and the left transistor T3-1 may increase due to a kickback voltage or a parasitic capacitance, and the leakage current flowing from the intermediate nodes S31/D32 to the drain D31 of the left transistor T3-1 may occur. When the leakage current occurs, the voltage of the gate G1 may increase, and the light emitting element LD (refer to FIG. 2) may emit a light with a brightness that is darker than a desired grayscale.

Referring to FIGS. 6A and 6B, the drain/source field reduction effect may occur in at least the second area 2 of the drain D31 of the left transistor T3-1, and thus, the leakage current may be reduced or prevented.

Hereinafter, an operation of the first transistor T1 and the third transistors T3-1 and T3-2 in the light emitting period corresponding to the data voltage with intermediate grayscale will be described with reference to FIG. 6G.

The gate G1 of the first transistor T1 may have a voltage of about 3V to correspond to the intermediate grayscale data voltage charged in the capacitor CP (refer to FIG. 2). In this case, the source S32 of the right transistor T3-2 may have a voltage of about 2V. During the light emitting period, the third transistors T3-1 and T3-2 may be turned off, however, the leakage current flowing from the drain D31 of the left transistor T3-1 or the intermediate nodes S31/D32 to the source S32 of the right transistor T3-2 may occur. When the leakage current occurs, the voltage of the gate G1 may decrease, and thus, the light emitting element LD (refer to FIG. 2) may emit the light with a brightness that is brighter than the desired grayscale.

Referring to FIGS. 6A and 6B, the drain/source field reduction effect may occur in at least the second area 2 of the source S32 of the right transistor T3-2, and thus, the leakage current may be reduced or prevented.

Figure 7A:
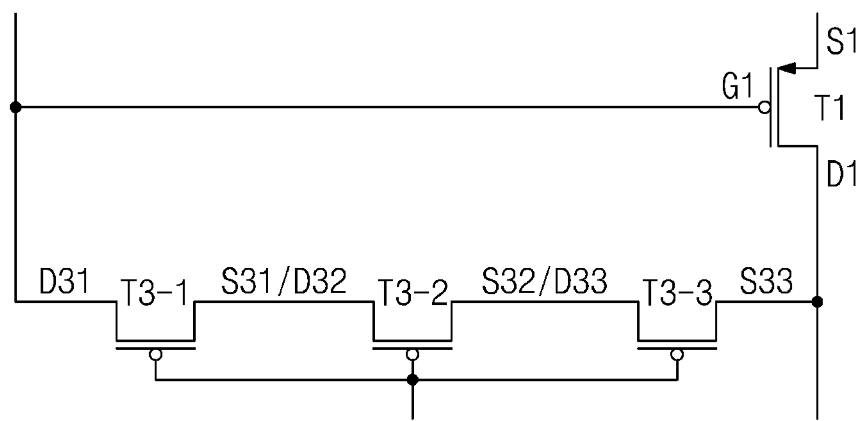
FIG. 7A is a circuit diagram showing third transistors according to some embodiments of the present disclosure.
Figure 7B:
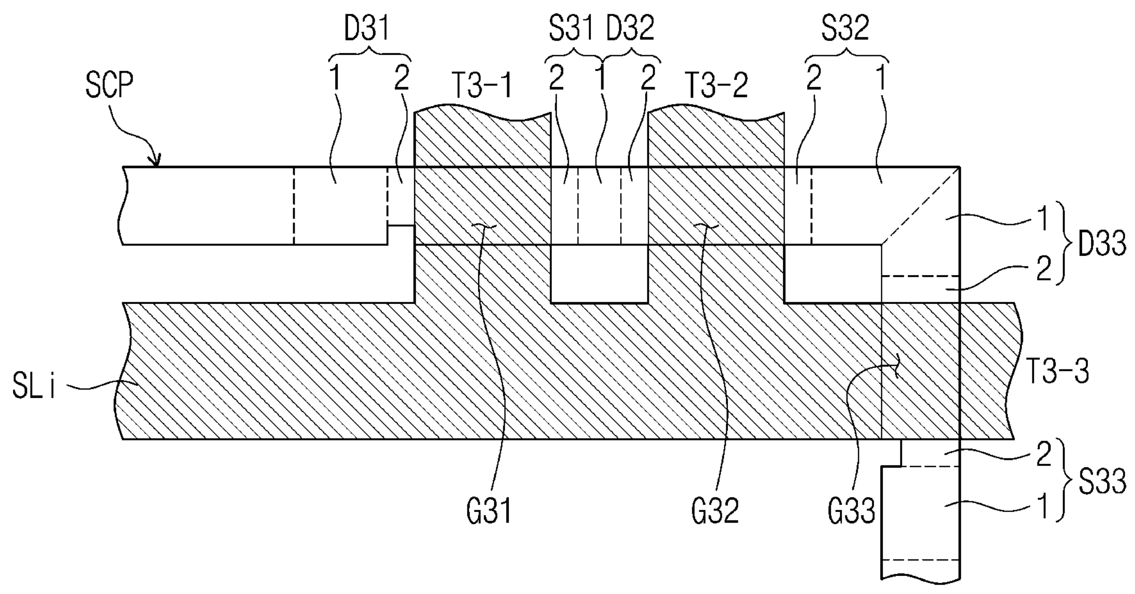
FIG. 7B is a plan view showing the third transistors according to some embodiments of the present disclosure.
Figure 7C:
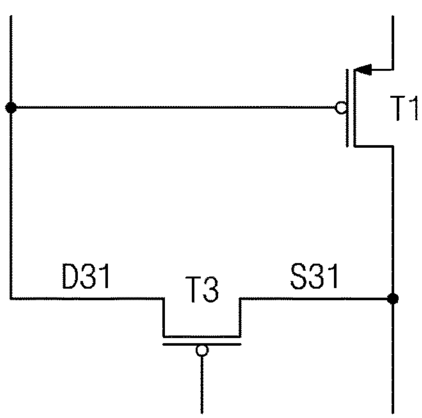
FIG. 7C is a circuit diagram showing a third transistor according to some embodiments of the present disclosure.
Figure 7D:
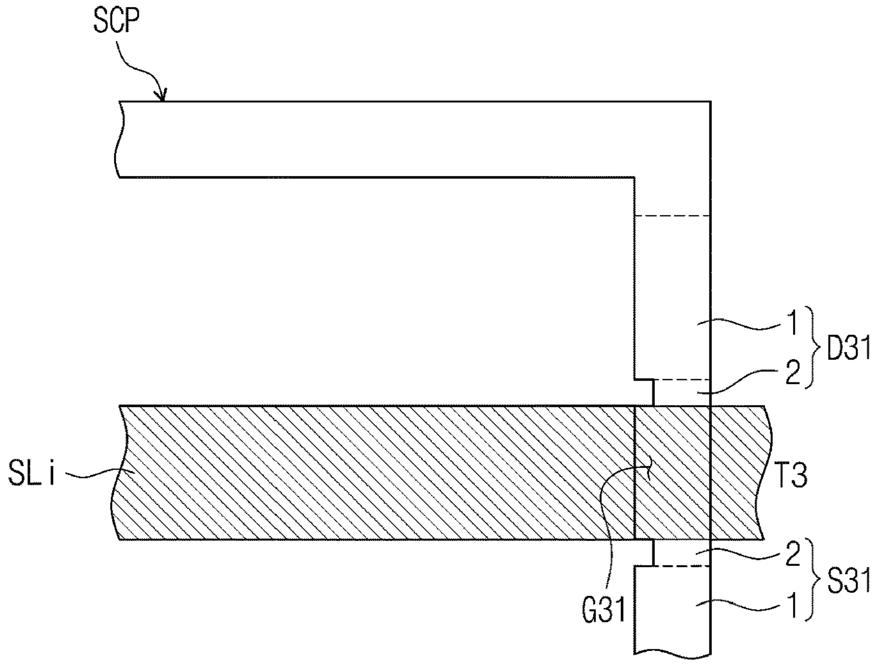
FIG. 7D is a plan view showing the third transistor according to some embodiments of the present disclosure.

FIG. 7A is a circuit diagram showing third transistors T3-1, T3-2, and T3-3 according to some embodiments of the present disclosure. FIG. 7B is a plan view showing the third transistors T3-1, T3-2, and T3-3 according to some embodiments of the present disclosure. FIG. 7C is a circuit diagram showing a third transistor T3 according to some embodiments of the present disclosure. FIG. 7D is a plan view showing the third transistor T3 according to some embodiments of the present disclosure. Hereinafter, detailed descriptions of the components already described with reference to FIGS. 1 to 6G are omitted.

Referring to FIG. 7A, n (n is a natural number equal to or greater than 2) third transistors T3-1 to T3-3 may be connected between the gate G1 and the drain D1 of the first transistor T1 in series. In some embodiments, n is 3.

Among the third transistors T3-1 to T3-3, a drain area D31 of a leftmost transistor T3-1 located nearest to the gate G1 of the first transistor T1 in the current path between the gate G1 and the drain D1 of the first transistor T1 may include a first area 1 and a second area 2. Among the third transistors T3-1 to T3-3, a source area S33 of a rightmost transistor T3-3 located farthest from the gate G1 of the first transistor T1 may include a first area 1 and a second area 2.

Referring to FIG. 7B, the second area 2 of the drain area D31 of the leftmost transistor T3-1 and the second area 2 of the source area S33 of the rightmost transistor T3-3 may have a relatively small width. The source area S31 of the leftmost transistor T3-1 and the drain area D33 of the rightmost transistor T3-3 may have substantially the same width. A drain area D32 and a source area S32 of the transistor T3-2 located between the transistors T3-1 and T3-3 may have substantially the same width.

As described with reference to FIGS. 6F and 6G, the occurrence of the leakage current may be reduced or prevented by the leftmost transistor T3-1 in the light emitting period corresponding to the data voltage with the high grayscale, and the occurrence of the leakage current may be reduced or prevented by the rightmost transistor T3-3 in the light emitting period corresponding to the data voltage with the intermediate grayscale.

Referring to FIG. 7C, one third transistor T3 may be connected between the gate G1 and the drain D1 of the first transistor T1. Referring to FIG. 7D, a second area 2 of a drain area D31 of the third transistor T3 and a second area 2 of a source area S31 of the third transistor T3 may have a small width compared with other areas of the semiconductor pattern SCP. The leakage current may not occur, or may not occur to a significant degree, in the third transistor T3.

Figure 8A:
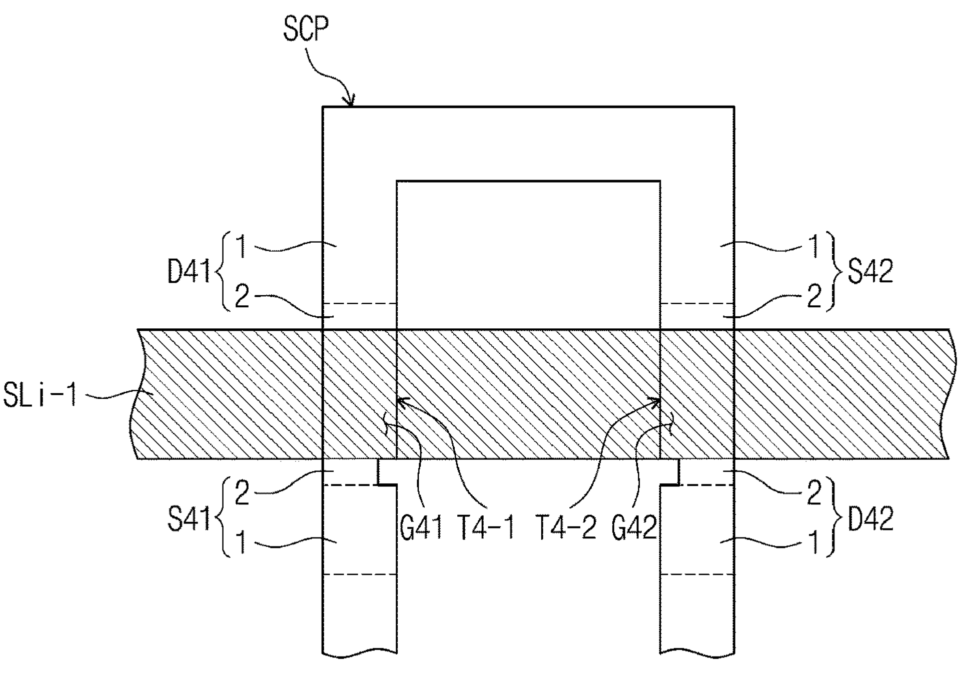
FIG. 8A is a plan view showing fourth transistors according to some embodiments of the present disclosure.
Figure 8B:
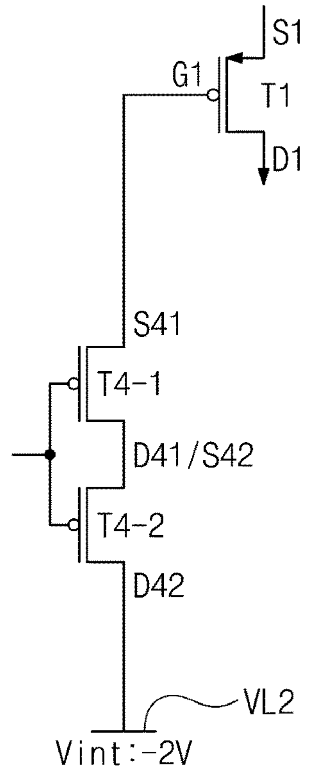
FIG. 8B is a circuit diagram showing operations of a first transistor and fourth transistors according to some embodiments of the present disclosure.

FIG. 8A is a plan view showing the fourth transistors T4-1 and T4-2 according to some embodiments. FIG. 8B is a circuit diagram showing an operation of the first transistor T1 and the fourth transistors T4-1 and T4-2 in the light emitting period. Hereinafter, repeated detailed descriptions of the components described with reference to FIGS. 1 to 6G are omitted.

Two fourth transistors T4-1 and T4-2 are shown as a representative example, however, one or three or more transistors may be connected between the gate G1 of the first transistor T1 and the second voltage line VL2 in series.

According to some embodiments, among the fourth transistors T4-1 and T4-2, the transistor located relatively close to the gate G1 of the first transistor T1 in the current path between the gate G1 of the first transistor T1 and the second voltage line VL2 is defined as a left transistor T4-1, and the transistor located relatively far from the gate G1 of the first transistor T1 is defined as a right transistor T4-2.

According to some embodiments, at least a second area 2 of a source area S41 of the left transistor T4-1 and a second area 2 of a drain area D42 of the right transistor T4-2 may have a relatively small width. The initialization voltage Vint may be a bias voltage from about −2V to about −3V. Because the gate G1 of the first transistor T1 may have a voltage from about 1V to about 4V during the light emitting period, a leakage current path may be formed from the gate G1 of the first transistor T1 to the second voltage line VL2. The drain area D42 of the right transistor T4-2 may reduce leakage current or prevent the leakage current from occurring.

The source area S41 of the left transistor T4-1 may reduce or prevent the leakage current from temporarily flowing from intermediate nodes D41/S42 of the fourth transistors T4-1 and T4-2 to the gate G1 of the first transistor T1 during the light emitting period.

Figure 9A:
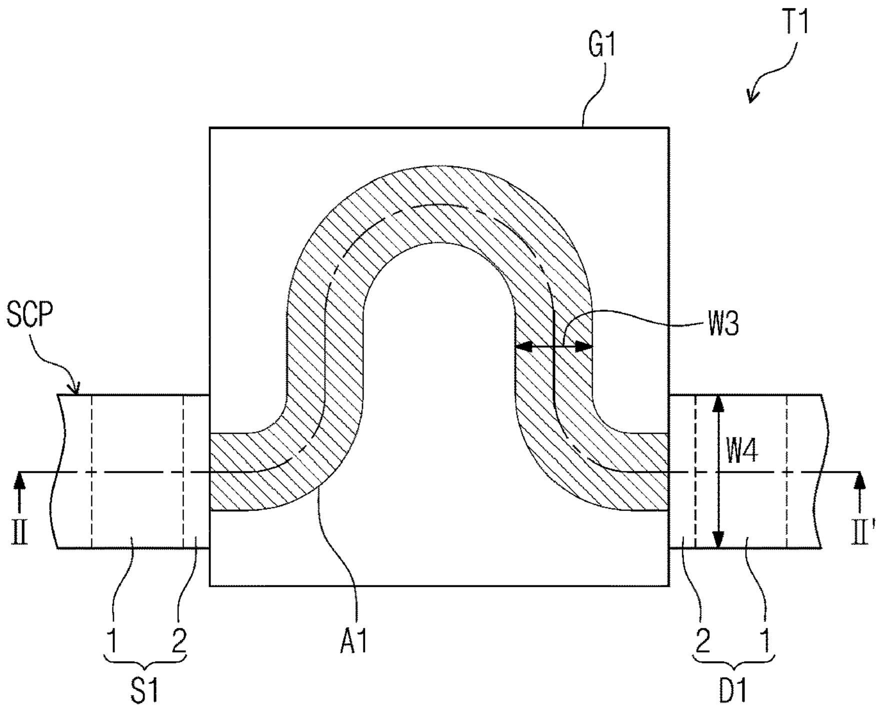
FIG. 9A is a plan view showing a first transistor according to some embodiments of the present disclosure.
Figure 9B:
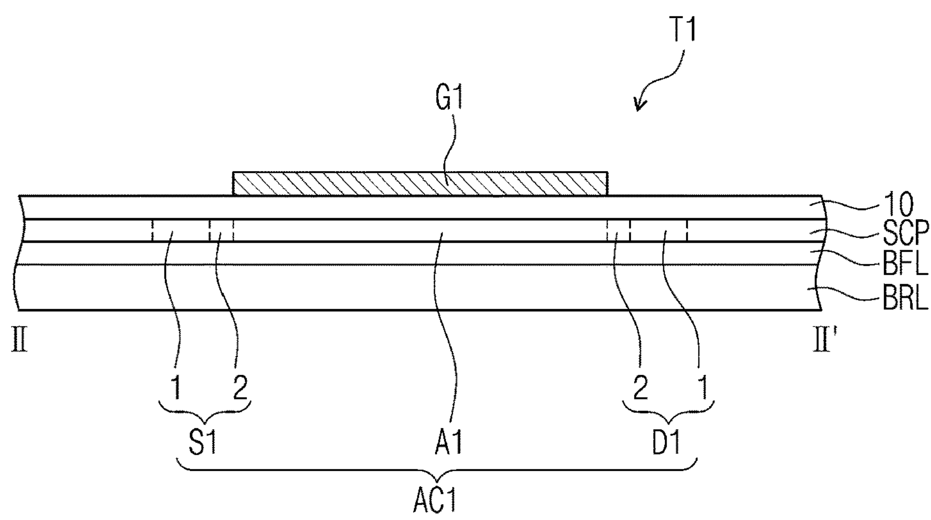
FIG. 9B is a cross-sectional view taken along the line II-II' of FIG. 9A to show the first transistor.

FIG. 9A is a plan view showing a first transistor T1 according to some embodiments of the present disclosure. FIG. 9B is a cross-sectional view taken along the line II-II' of FIG. 9A. Hereinafter, detailed descriptions of the components described with reference to FIGS. 1 to 8B are omitted.

The first transistor T1 may include a semiconductor area AC1 including a source area S1, a drain area D1, a channel area A1 located between the source area S1 and the drain area D1, and a gate G1 overlapping the channel area A1. The first transistor T1 may be doped by the same method described with reference to FIG. 6E. Accordingly, each of the source area S1 and the drain area D1 may include a first area 1 and a second area 2.

When the second area 2 causes the drain/source field reduction effect, a driving current may be reduced in the turned-on state of the first transistor T1. According to some embodiments, the second area 2 may be designed to have the resistance that is less than the reference value such that the second area 2 does not have the drain/source field reduction effect. The second area 2 may have a width W4 that is greater than a width W3 of the channel area A1 to reduce the resistance of the second area 2. The width W4 of the second area 2 may be about 5% to about 20% greater than the width W3 of the channel area A1.

The entire area of the source area S1 and the drain area D1 may have a width that is greater than that of the channel area A1. The source area S1 may have a uniform width, and the drain area D1 may have a uniform width.

The width W4 of the source area S1 of or the drain area D1 of the first transistor T1 may be greater than the width of the source areas S31 and S32 or the drain areas D31 and D32 of the third transistors T3-1 and T3-2 shown in FIGS. 6A and 6B. The semiconductor pattern SCP shown in FIG. 5B and having an integral shape may be patterned to have different widths depending on areas of the semiconductor pattern SCP.

Although the embodiments of the present disclosure have been described, it is understood that the present disclosure should not be limited to these embodiments but various changes and modifications can be made by one ordinary skilled in the art within the spirit and scope of the present disclosure as hereinafter claimed.

Therefore, the disclosed subject matter should not be limited to any single embodiment described herein, and the scope of the present disclosure shall be determined according to the attached claims, with functional equivalents thereof to be included therein.

What is claimed is:

1. A display device comprising:

a first transistor;

a second transistor electrically connected to the first transistor, and configured to output a data signal;

n (n being a natural number equal to or greater than 2) third transistors electrically connected to a gate of the first transistor and connected to each other in series;

a capacitor configured to be charged with a voltage corresponding to the data signal; and a light emitting element electrically connected to the first transistor, wherein each of the third transistors comprises:

a semiconductor area comprising a channel area, a source area, and a drain area spaced from the source area with the channel area therebetween in an extension direction; and a gate overlapping the channel area, and wherein a first one of the source area and the drain area that is closer to the gate of the first transistor, and that is of a first one of the third transistors that is located closest to the gate of the first transistor, comprises:

a first area; and a second area between the first area and the channel area, having a doping concentration that is lower than a doping concentration of the first area, and having a width that is less than a width of the first area and that is less than a width of the channel area in a reference direction that is substantially perpendicular to the extension direction in a plan view.

2. The display device of claim 1, wherein a second one of the source area and the drain area that is farther from the gate of the first transistor, and that is of a second one of the third transistors that is located farthest from the gate of the first transistor, comprises;

a third area; and a fourth area between the third area and the channel area, having a doping concentration that is lower than a doping concentration of the third area, and having a width that is less than a width of the third area in the reference direction.

3. The display device of claim 1, wherein a second one of the source area and the drain area that is farther from the gate of the first transistor, and that is of the first one of the third transistors, comprises a third area, and a fourth area between the third area and the channel area, and having a doping concentration that is lower than a doping concentration of the third area.

4. The display device of claim 3, wherein the third area and the fourth area have substantially a same width in the reference direction.

5. The display device of claim 1, wherein the width of the second area in the reference direction is in a range from about 1 μm to about 2 μm.

6. The display device of claim 1, wherein the width of the second area is about 10% to about 50% less than the width of the first area.

7. The display device of claim 1, wherein the second area has a length from about 0.1 μm to about 0.5 μm in the extension direction.

8. The display device of claim 1, wherein the first transistor and the third transistors comprise P-type polysilicon transistors, and wherein the third transistors are connected between the gate of the first transistor and a source area or a drain area of a semiconductor area of the first transistor.

9. The display device of claim 8, wherein the source area of the first one of the third transistors and the drain area of a second one of the third transistors that is farthest from the gate of the first transistor have substantially a same width in the reference direction.

10. The display device of claim 8, wherein the drain area and the source area of a third one of the third transistors between the first one of the third transistors and a second one of the third transistors that is farthest from the gate of the first transistor among the third transistors have substantially a same width in the reference direction.

11. The display device of claim 1, wherein the first transistor comprises a semiconductor area comprising a channel area overlapping the gate of the first transistor, a source area, and a drain area spaced apart from the source area with the channel area therebetween, and wherein at least one of the source area or the drain area of the first transistor has a width that is greater than a width of the channel area of the first transistor.

12. The display device of claim 11, wherein the width of the at least one of the source area or the drain area of the first transistor is about 5% to about 20% greater than the width of the channel area of the first transistor.

13. The display device of claim 11, wherein each of the source area and the drain area of the first transistor comprises a third area, and a fourth area between the third area and the channel area, and having a doping concentration that is lower than a doping concentration of the third area, and wherein the third area and the fourth area have substantially a same width.

14. The display device of claim 11, wherein the width of the source area or the drain area of the first transistor is greater than a width of the semiconductor area of each of the third transistors.

15. The display device of claim 1, wherein the first transistor and the third transistors comprise P-type polysilicon transistors, and wherein the third transistors are connected between the gate of the first transistor and a voltage line for receiving an initialization voltage.

16. The display device of claim 1, wherein the capacitor is electrically connected between the gate of the first transistor and a voltage line for receiving a power source voltage.

17. A display device comprising:

a first transistor;

a second transistor electrically connected to the first transistor, and configured to output a data signal;

n (n is a natural number equal to or greater than 2) third transistors electrically connected to a gate of the first transistor, and connected to each other in series;

a capacitor configured to be charged with a voltage corresponding to the data signal; and a light emitting element electrically connected to the first transistor, wherein each of the third transistors comprises:

a semiconductor area comprising a channel area, a source area, and a drain area spaced apart from the source area with the channel area therebetween in an extension direction; and a gate overlapping the channel area, and wherein an one of the source area and the drain area that is farther from the gate of the first transistor, and that is of one of the third transistors that is located farthest from the gate of the first transistor comprises:

a first area; and a second area between the first area and the channel area, having a doping concentration that is lower than a doping concentration of the first area, and having a width that is less than a width of the first area and that is less than a width of the channel area in a reference direction that is substantially perpendicular to the extension direction in a plan view.

18. A display device comprising:

a first transistor;

a second transistor electrically connected to the first transistor, and configured to output a data signal;

a third transistor electrically connected to a gate of the first transistor; and a light emitting element electrically connected to the first transistor, wherein the third transistor comprises:

a semiconductor area comprising a channel area, a source area, and a drain area spaced apart from the source area with the channel area therebetween in an extension direction; and a gate overlapping the channel area, and wherein at least one of the drain area or the source area comprises;

a first area; and a second area between the first area and the channel area, having a doping concentration that is lower than a doping concentration of the first area, and having a width that is less than a width of the first area and that is less than a width of the channel area in a reference direction substantially perpendicular to the extension direction in a plan view.

19. The display device of claim 1, wherein a width of at least one of the source area or the drain area of another one of the third transistors is substantially a same as the width of the channel area of the other one of the third transistors.

* * * * *